United States Patent
Piernas et al.

(10) Patent No.: US 12,206,031 B2
(45) Date of Patent: Jan. 21, 2025

(54) MONOLITHIC PIN AND SCHOTTKY DIODE INTEGRATED CIRCUITS

(71) Applicant: MACOM Technology Solutions Holdings, Inc., Lowell, MA (US)

(72) Inventors: Belinda Simone Edmee Piernas, Mason, NH (US); David Russell Hoag, Walpole, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 17/806,193

(22) Filed: Jun. 9, 2022

(65) Prior Publication Data

US 2023/0402549 A1    Dec. 14, 2023

(51) Int. Cl.
*H01L 29/87* (2006.01)
*H01L 21/8252* (2006.01)
(Continued)

(52) U.S. Cl.
CPC ........ *H01L 29/872* (2013.01); *H01L 21/8252* (2013.01); *H01L 29/868* (2013.01)

(58) Field of Classification Search
None
See application file for complete search history.

(56) References Cited

U.S. PATENT DOCUMENTS

| | | | |
|---|---|---|---|
| 5,753,960 A | 5/1998 | Dickmann | |
| 7,989,277 B1 * | 8/2011 | Luh | H01L 21/8252 257/E21.047 |

(Continued)

FOREIGN PATENT DOCUMENTS

EP    0710984 B1    8/2001

OTHER PUBLICATIONS

Ho W-J et al: "Monolithic Integration of Hemts and Schottky Diodes for Millimeter Wave Circuits," Proceedings of the Gallium Arsenide Integrated Circuit Symposium (GAAS IC) Nashville, Nov. 6-9, 1988; [Proceedings of the Gallium Arsenide Integrated Circuit Symposium. (GAAS IC)], New York, IEEE, US, vol. SYMP. 10, Nov. 6, 1988, pp. 301-304, XP000093209.
(Continued)

*Primary Examiner* — Bilkis Jahan
(74) *Attorney, Agent, or Firm* — Perilla Knox & Hildebrandt LLP; Jason M. Perilla

(57) ABSTRACT

A number of Monolithic Microwave Integrated Circuit (MMIC) devices including combinations of PIN and Schottky diodes, with integrated passive electrical components fabricated and electrically connected among them, are described herein, along with new process techniques for forming the MMIC devices. In one example, a monolithic semiconductor includes a substrate, a plurality of layers of semiconductor materials over the substrate, Schottky and Ohmic contacts on a first subset of the plurality of layers for a Schottky diode, and PIN diode Ohmic contacts on a second subset of the plurality of layers for a PIN diode. The device can also include an etch stop layer between the first subset of the plurality of layers and the second subset of the plurality of layers. The etch stop layer facilitates selective etching and isolation of the Schottky diode from the PIN diode by consecutive etchings.

22 Claims, 18 Drawing Sheets

(51) Int. Cl.
*H01L 29/868* (2006.01)
*H01L 29/872* (2006.01)

(56) References Cited

U.S. PATENT DOCUMENTS

| | | | |
|---|---|---|---|
| 9,087,923 B2 | 7/2015 | Lin et al. | |
| 11,270,928 B2 | 3/2022 | Rozbicki et al. | |
| 2010/0308337 A1* | 12/2010 | Sriram | H01L 29/267 257/77 |
| 2014/0138701 A1* | 5/2014 | Huang | H01L 27/0629 257/76 |
| 2014/0239346 A1* | 8/2014 | Green | H01L 29/7787 257/192 |
| 2015/0155273 A1* | 6/2015 | Nakajima | H01L 29/045 257/76 |
| 2017/0271327 A1* | 9/2017 | Jiang | H01L 23/3171 |
| 2019/0229114 A1* | 7/2019 | Boles | H01L 21/76264 |
| 2019/0229115 A1* | 7/2019 | Boles | H01L 21/02389 |
| 2020/0013774 A1 | 1/2020 | Lin et al. | |
| 2020/0020681 A1* | 1/2020 | Boles | H01L 27/0629 |
| 2020/0043913 A1 | 2/2020 | Wu | |

OTHER PUBLICATIONS

Huang P et al., "A 9-16 GHz monolithic HEMT low noise amplifier with embedded limiters," Microwave Symposium Digest, 1995., IEEE MTT-S International Orlando, FL, USA May 16-20, 1995, New York, NY, USA, IEEE, US, May 16, 1995, pp. 205-206, XP010612424, DOI: 10.1109/MWSYM.1995.406065 ISBN: 978-0-7803-2581-4.
International Search Report and Written Opinion in PCT/US2022/081538, mailed Mar. 31, 2023.

* cited by examiner

MONOLITHIC PIN AND SCHOTTKY DIODE INTEGRATED CIRCUITS

BACKGROUND

A PIN (P-type-Intrinsic-N-type) diode is a diode with an undoped intrinsic semiconductor region between a P-type semiconductor layer or region and an N-type semiconductor layer or region. The P-type and N-type regions are typically heavily doped and electrically coupled to ohmic contacts. The inclusion of the intrinsic region between the P-type and N-type layers contrasts with an ordinary PN diode, which does not include an intrinsic region.

PIN diodes can be found in limiter and switch circuits, among other types of circuits. PIN diodes are relied upon to protect receiver circuitry in limiter circuits, often over a wide frequency range. Traditionally, PIN diode devices have been fabricated by the growth, deposition, or other placement of layers of semiconductor materials over a substrate. Various types of PIN diodes, including PIN diodes of different "I" region thicknesses, have been designed for use in limiter circuits. Some PIN diodes have been designed for use in passive limiter control circuits to protect sensitive receiver components, such as low noise amplifiers (LNA), detectors, and mixers. PIN diodes can be designed for operation over a wide frequency range from DC to 110 GHz or higher.

PIN diodes are often used in limiting circuits for radar systems and front-end modules of radio frequency (RF) transceivers, where both the transmitter and the receiver are tuned to approximately the same frequency. Receivers in such systems are sensitive and can be damaged by even a small portion of transmitted power leaking through or being reflected toward the receiver. PIN diodes can be used as reflective limiters in such RF transceivers to protect receiver components, among other uses.

SUMMARY

A number of Monolithic Microwave Integrated Circuit (MMIC) devices including combinations of PIN and Schottky diodes, with integrated passive electrical components fabricated and electrically connected among them, are described herein, along with new process techniques for forming the MMIC devices. In one example, a monolithic semiconductor includes a substrate, a plurality of layers of semiconductor materials over the substrate, Schottky and Ohmic contacts on a first subset of the plurality of layers for a Schottky diode, and PIN diode Ohmic contacts on a second subset of the plurality of layers for a PIN diode. The device can also include an etch stop layer between the first subset of the plurality of layers and the second subset of the plurality of layers. The etch stop layer facilitates selective etching and isolation of the Schottky diode from the PIN diode by consecutive etchings.

In one example, a monolithic semiconductor includes a substrate, a plurality of layers of semiconductor materials over the substrate, Schottky and Ohmic contacts on a first subset of the plurality of layers for a Schottky diode, and PIN diode Ohmic contacts on a second subset of the plurality of layers for a PIN diode. The monolithic semiconductor can also include an etch stop layer between the first subset of the plurality of layers and the second subset of the plurality of layers. The substrate can be embodied as a Gallium Arsenide substrate in some examples.

The PIN diode can include a plurality of PIN diodes, and the Schottky diode can include a plurality of Schottky diodes in some examples. In one example, a first PIN diode among the plurality of PIN diodes is series connected and a second PIN diode among the plurality of PIN diodes is shunt connected. In another example, a first Schottky diode among the plurality of Schottky diodes is series connected and a second Schottky diode among the plurality of Schottky diodes is shunt connected.

The first subset of the plurality of layers can include an active Schottky layer and a cathode layer, and the monolithic semiconductor further can include an etch stop layer under the cathode layer. The second subset of the plurality of layers can include an anode layer, an intrinsic layer, and a second cathode layer under the etch stop layer. In another example, the plurality of layers can include a first cathode layer, an intrinsic semiconductor layer, an anode layer, a second cathode layer, and an active Schottky layer. The plurality of layers can also include an etch stop layer between the anode layer and the second cathode layer. In other examples, the monolithic semiconductor can also include a passivation layer over the PIN diode and the Schottky diode.

In other examples, the monolithic semiconductor can also include an electrical component over the substrate and electrically connected to at least one of the Schottky diode and the PIN diode. As examples, the monolithic semiconductor can include a metal-insulator-metal capacitor, a resistor, and an inductor over the substrate. The capacitor, resistor, inductor, PIN diode, and Schottky diode can be electrically connected as a monolithic microwave integrated circuit limiter. As additional examples, the monolithic semiconductor can also include a radio frequency coupler over the substrate.

In other aspects, the monolithic semiconductor can include a via that extends from a backside of the substrate to a cathode contact of the PIN diode. The monolithic semiconductor can also include a via that extends from a backside of the substrate to a cathode contact of the Schottky diode. In other examples, the monolithic semiconductor can include a passive circuit element over the substrate and a via that extends from a backside of the substrate to a contact of the passive circuit element.

In other aspects, the monolithic semiconductor can include a back side metallization on a backside of the substrate. The back side metallization can extend into the via and be electrically connected to one of a cathode contact of the PIN diode, a cathode contact of the Schottky diode, or a passive circuit element over the substrate.

In other examples, the first subset of the plurality of layers includes an active Schottky layer and a first cathode layer. The monolithic semiconductor further includes a first etch stop layer over the Schottky layer and a second etch stop layer under the first cathode layer. The monolithic semiconductor further includes at least one semiconductor layer over the first etch stop layer, and the second subset of the plurality of layers comprises an anode layer, an intrinsic layer, and a second cathode layer under the second etch stop layer.

In another example, a monolithic Schottky-enhanced PIN diode limiter includes a substrate, a plurality of layers of semiconductor materials over the substrate, Schottky and Ohmic contacts on a first subset of the plurality of layers for a Schottky diode, PIN diode Ohmic contacts on a second subset of the plurality of layers for a PIN diode, a passivation layer over the Schottky diode and the PIN diode, and passive circuit elements for the limiter, the passive circuit elements formed over the passivation layer. The passive circuit elements can include a capacitor, an inductor, and an RF coupler. The monolithic Schottky-enhanced PIN diode limiter can include an etch stop layer between the first subset of the plurality of layers and the second subset of the plurality of layers. The first subset of the plurality of layers can include an active layer and a first cathode layer over the etch stop layer, and the second subset of the plurality of layers comprises an anode layer, an intrinsic layer, and a second cathode layer under the etch stop layer.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
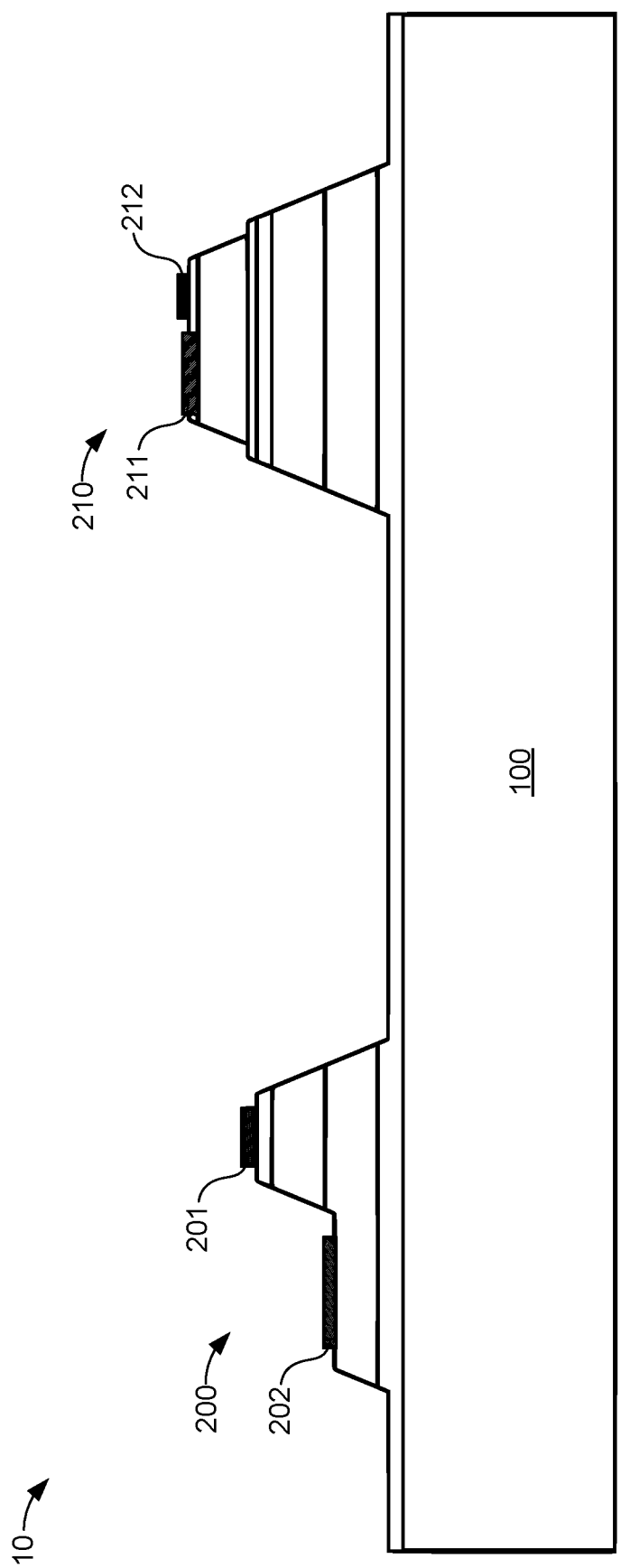
FIG. 1 illustrates an integrated monolithic semiconductor structure including a PIN diode and a Schottky diode over a common substrate according to various aspects of the examples described herein.

PIN diodes can be used as reflective limiters in RF transceivers to protect receiver components, among many other uses. The response of PIN-diode-based reflective limiters is not ideal in all cases, and the frequency response, leakage characteristics (e.g., flat and spike leakage), 1 dB compression (P1 dB) threshold, and maximum handling power capability can be limited. Those response characteristics are related to the physics of the PIN diode, the geometry of the PIN diode, and the configuration of the limiter circuit.

Adding a Schottky diode to a PIN diode reflective limiter can enhance the performance of the limiter, due to the lower turn-on voltage of the Schottky diode. Different configurations of Schottky-enhanced or hybrid PIN diode limiters are available with different levels of performance. However, existing hybrid limiter circuits use discrete Schottky diodes. Such hybrid limiter circuits are assembled using separate chips and wires, the use of flip-chip diodes assembled on a PCB board, the integrated PIN limiter die, or other combinations of discrete components. Such hybrid limiter circuits are limited in frequency bandwidth, with poor small signal performance (e.g., poor insertion loss, return loss, etc.), and high cost.

According to the aspects of the embodiments, new Monolithic Microwave Integrated Circuit (MMIC) devices including PIN diodes, Schottky diodes, and integrated passive electrical components are described herein, along with new process techniques for forming the MMIC devices. In one example, a MMIC device includes a substrate, a plurality of layers of semiconductor materials over the substrate, Schottky diode contacts on a first subset of the plurality of layers for a Schottky diode, and PIN diode contacts on a second subset of the plurality of layers for a PIN diode. The device can also include an etch stop layer between the first subset of the plurality of layers and the second subset of the plurality of layers. The etch stop layer facilitates selective etching and isolation of the Schottky diode from the PIN diode.

The new MMIC devices and processes can incorporate passive electrical components or devices (e.g., Metal-Insulator-Metal (MIM) capacitors, resistors, transmission lines, inductors, RF couplers, and other components) to facilitate the fabrication of hybrid MMIC Schottky-enhanced PIN diode limiters of various configurations. The new MMIC devices and processes can incorporate via holes through the MMIC substrate for ground connections in some cases. The Schottky-enhanced PIN diode limiters benefit from enhanced leakage characteristics and higher power handling capability than other PIN diode reflective limiters. They also offer greater small signal performance, higher frequency of operation, and lower cost than discrete hybrid limiters, among other benefits.

According to aspects of the examples described herein, a stack of semiconductor material layers can be grown over a substrate of semi-insulating Gallium Arsenide (GaAs). The stack of semiconductor material layers can include an active Schottky GaAs layer and an N+ GaAs cathode layer forming a junction for one or more Schottky diodes, formed over a P+ Aluminum Gallium Arsenide (AlGaAs) anode material layer, an intrinsic GaAs material layer, and an N+ GaAs cathode material layer forming a junction for one or more PIN diodes. An etch stop layer between the N+ GaAs cathode material layer for the Schottky diodes and the P+ AlGaAs anode material layer of the PIN diodes facilitates selective etching and isolation of the Schottky diodes from each other and from the PIN diodes by consecutive etchings. Passivation layers further isolate the diodes from each other and subsequently formed passive devices from the substrate.

According to other aspects, a monolithic Schottky-enhanced PIN diode limiter can include an input port, an output port, an input DC blocking capacitor, an output DC blocking capacitor, one or more PIN diodes arranged in a shunt configuration, a radio frequency (RF) coupler, an RF choke inductor, one or more Schottky diodes, and a DC ground return formed through one of the Schottky diodes or the RF coupler.

Turning to the drawings, FIG. 1 illustrates an integrated monolithic semiconductor structure 10 including a PIN diode 200 and a Schottky diode 210. FIG. 1 is provided as a representative example of two different types of diode devices formed together over a common substrate in an integrated fashion. FIG. 1 is not necessarily drawn to scale. Although one PIN diode 200 and one Schottky diode 210 are shown in FIG. 1, several PIN and Schottky diodes can be formed together over the substrate 100 using the techniques described herein. PIN diode 200 and Schottky diode 210 can be formed in a Series or a Shunt configuration. Additionally, a number of passive electrical components, including resistors, metal-insulator-metal (MIM) capacitors, inductors, transmission lines, RF couplers, and other components can be formed and electrically coupled to the PIN diode 200 and the Schottky diode 210, to form hybrid limiters and other integrated circuits. Examples of such Schottky-enhanced PIN diode limiters are described in further detail below with reference to FIGS. 13-19.

A plurality of layers of semiconductor materials are formed over the substrate 100. The arrangement and composition of the layers are described in additional detail below. The integrated structure 10 also includes Schottky diode contacts 211 and 212 on a first subset of the layers and PIN diode contacts 201 and 202 on a second subset of the layers. The contact 211 (also "cathode Ohmic contact 211") provides a cathode Ohmic contact for the Schottky diode 210, and the contact 212 (also "anode Schottky contact 212") provides an anode Schottky contact for the Schottky diode 210. The contact 201 (also "anode Ohmic contact 201") provides an anode Ohmic contact for the PIN diode 200, and the contact 202 (also "cathode Ohmic contact 202") provides a cathode Ohmic contact for the PIN diode 200.

The PIN diode 200 and the Schottky diode 210 are formed from a common stack of semiconductor material layers over the substrate 100. Certain regions of the layers are isolated from each other through selective etching steps, to separate the PIN diode 200 and the Schottky diode 210. An etch stop layer is positioned between the first subset of semiconductor layers for the Schottky diode 210 and the second subset of semiconductor layers for the PIN diode 200. The etch stop layer is relied upon to isolate the PIN diode 200 from the Schottky diode 210 through the selective etching steps and isolate Schottky diodes 210 from each other.

Figure 12:
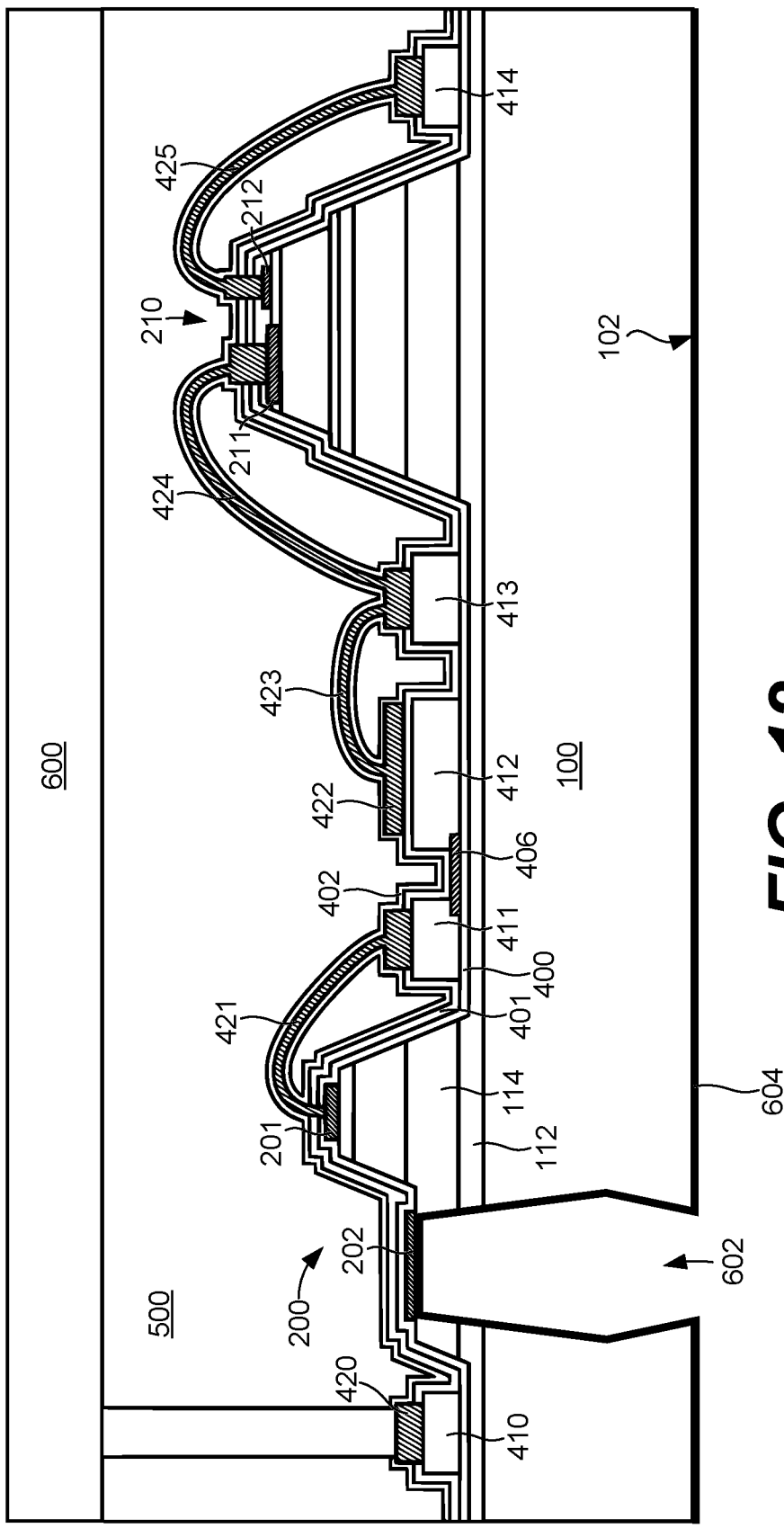
FIG. 12 illustrates a cross-sectional view of the MMIC shown in FIG. 11 after backside processing according to various aspects of the examples described herein.

Once the PIN diode 200 and the Schottky diode 210 are formed as shown in FIG. 1, additional process steps can be relied upon to passivate and further electrically isolate the PIN diode 200 and the Schottky diode 210. Additional process steps can be relied upon to form passive electrical components over the substrate 100. The passive electrical components can be electrically to each other, to the PIN diode 200, and to the Schottky diode 210. Additional process steps can be relied upon to provide electrical connections on a backside of the substrate 100. With the additional electrical components and connections, the PIN diode 200 and the Schottky diode 210, among potentially other PIN and Schottky diodes, can be integrated together into a MMIC (see, e.g., FIG. 12). The MMIC can be embodied as a Schottky-enhanced PIN diode limiter circuit, as one example, although many other types of circuits can be formed using the techniques described herein.

Figure 2:
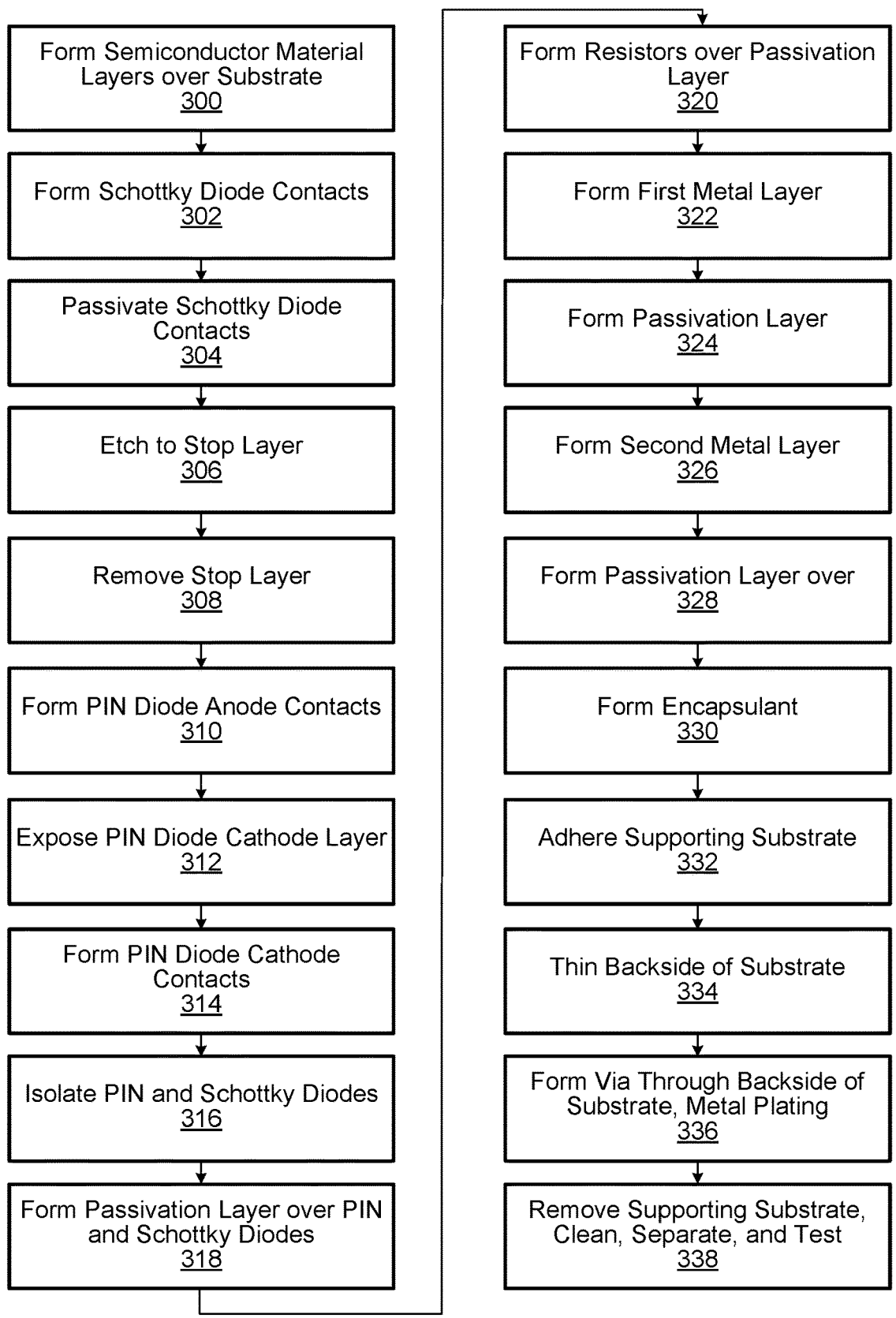
FIG. 2 illustrates a process for forming a Monolithic Microwave Integrated Circuit (MMIC) including PIN and Schottky diodes over a common substrate according to various aspects of the examples described herein.

FIG. 2 illustrates a process for forming a MMIC including PIN and Schottky diodes over a common substrate according to various aspects of the examples described herein. The process steps shown in FIG. 2 are provided as a representative example. FIG. 2 is not exhaustive, as other process steps can be included. Additionally, in some cases, one or more of the process steps shown in FIG. 2 can be omitted, and the arrangement of the steps can be altered or rearranged as compared to that shown.

The process shown in FIG. 2 can be relied upon to form the PIN diode 200 and the Schottky diode 210, as shown in FIG. 1, among other PIN and Schottky diodes. The process can also be relied upon to form passive electrical components over the substrate 100, to perform backside processing steps, and to form Schottky-enhanced PIN diode limiter and other MMIC circuit structures. The individual processing steps shown in FIG. 2 are described in further detail below with reference to FIGS. 3-12.

Figure 3:
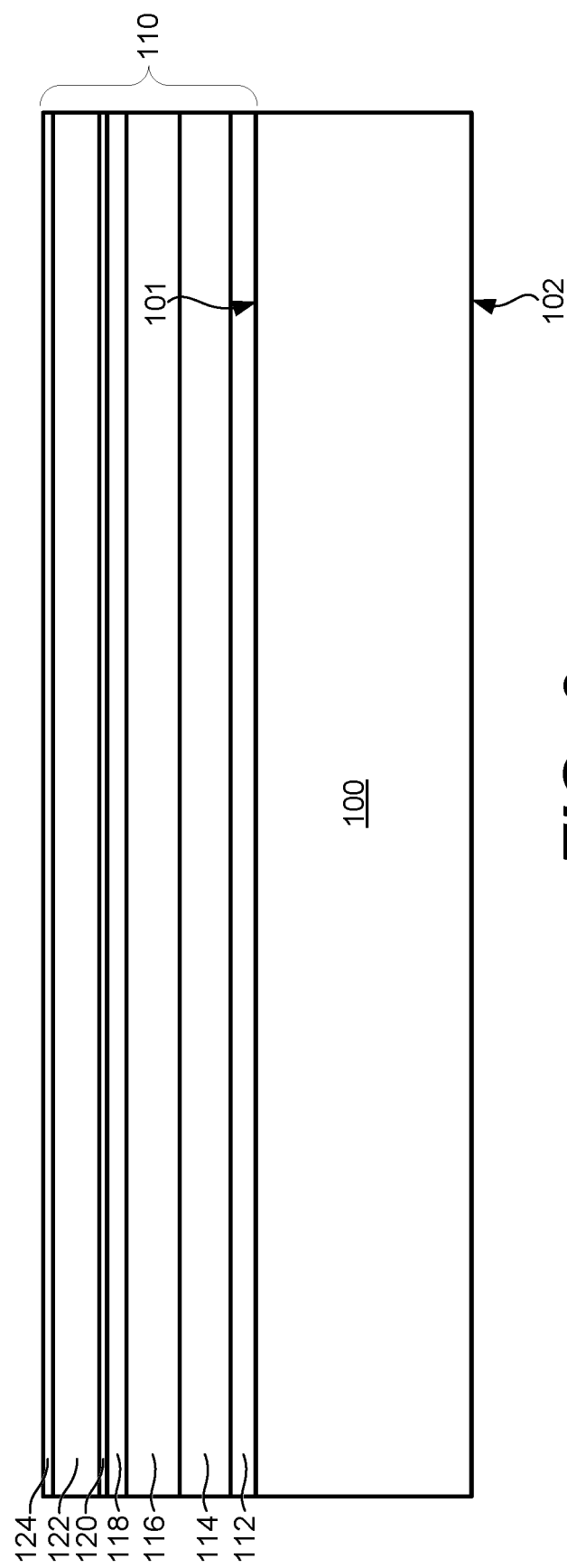
FIG. 3 illustrates a cross-sectional view of a stack of semiconductor material layers according to various aspects of the examples described herein.

At step 300, the process includes forming a stack of semiconductor material layers over a substrate. FIG. 3 illustrates a stack of semiconductor material layers 110 formed over the substrate 100, according to one example of step 300. The substrate 100 includes a top surface 101 and a bottom surface 102. In one example, the substrate 100 can be embodied as a substrate (e.g., wafer) of semi-insulating GaAs, although the substrate 100 can be embodied by other semiconducting materials in some cases. The layers 110 are formed over the top surface 101 of the substrate 100, as shown in FIG. 3. The substrate 100 can be thinned down in some cases to a final thickness (as measured from the top to the bottom of the page in FIG. 3) of between 25-200 µm, after the layers 110 are formed.

Among possibly other layers, the stack of semiconductor material layers 110 includes a buffer layer 112, a first cathode layer 114, an intrinsic layer 116, an anode layer 118, an etch stop layer 120, a second cathode layer 122, and an active layer 124. The second cathode layer 122 and the active layer 124 are a first subset of the layers 110 for one or more Schottky diodes. Thus, the active layer 124 comprises an active Schottky layer. The first cathode layer 114, intrinsic layer 116, and anode layer 118 are a second subset of the layers 110 for one or more PIN diodes. The etch stop layer 120 is positioned between the first subset of the layers 110 and the second subset of the layers 110.

The stack of semiconductor material layers 110 can be epitaxially grown, deposited, or otherwise formed over the top surface 101 of the substrate 100. In one example, the layers 110 can be formed using Metalorganic Chemical Vapour Deposition (MOCVD), although other epitaxial or deposition process steps can be used to form the layers 110. In some cases, a first epitaxial or deposition process step can be used to form a first group or set of the layers 110, and a different, second epitaxial or deposition process step can be used to form a second group or set of the layers 110.

Example material compositions, thicknesses, and other aspects of the layers 110 are provided below, although the examples are not exhaustive, as variations on the compositions and thicknesses of the layers 110 can also be relied upon to form combinations of PIN, NIP, and Schottky diodes in a monolithic format. The examples described herein can also be extended to include additional semiconductor material and etch stop layers beyond those shown in FIG. 3. For example, an additional etch stop layer can be formed over the active layer 124, and additional semiconductor layers can be formed over the additional etch stop layer. The additional semiconductor layers can be relied upon to form other devices, including diodes, transistors, and other devices.

The buffer layer 112 is formed on the top surface 101 of the substrate 100, as shown in FIG. 3. The buffer layer 112 can also be formed over the top surface 101 of the substrate 100 in some cases, with one or more additional layers of materials being formed between the top surface 101 of the substrate 100 and the buffer layer 112. The buffer layer 112 can be formed of AlGaAs ($Al_xGa_{1-x}As$) semiconductor material, which is often used as a barrier material in GaAs-based heterostructure devices. The "x" in $Al_xGa_{1-x}As$ is a number between 0 and 1 an indicates an alloy ratio between GaAs and AlAs. AlGaAs is used as an abbreviated form of $Al_xGa_{1-x}As$ herein, without any particular ratio between the GaAs and AlAs.

In one case, the buffer layer 112 can include 50% Aluminum (Al) (i.e., $Al_{0.5}Ga_{0.5}As$), although other concentrations of Al (e.g., 48-52% Al or other ranges) can be used in the buffer layer 112. The buffer layer can also be doped with a dopant, such as Oxygen (O) or other impurity, to a concentration of between $1 \times 10^{19}$ to $2 \times 10^{19}$ $cm^{-3}$. The buffer layer 112 can be epitaxially grown, deposited, or otherwise formed to a thickness of 1.0 µm±0.1 µm, although other thicknesses can be relied upon.

The first cathode layer 114 (also "PIN cathode layer 114") is formed on or over the buffer layer 112. The first cathode layer 114 can be formed of GaAs semiconductor material. The first cathode layer 114 can be doped with an N+-type dopant, such as Silicon (Si) or other dopant, to a concentration of between $2 \times 10^{18}$ to $4 \times 10^{18}$ $cm^{-3}$. The first cathode layer 114 can be epitaxially grown, deposited, or otherwise formed to a thickness of 2.0 µm±0.2 µm, although other thicknesses can be relied upon.

The intrinsic layer 116 (also "PIN intrinsic layer 116") is formed on the first cathode layer 114. The intrinsic layer 116 can be formed of GaAs semiconductor material. The intrinsic layer 116 is not doped or not-intentionally-doped GaAs semiconductor material. In one example, the intrinsic layer 116 can be epitaxially grown, deposited, or otherwise formed to a thickness of 2.0 µm±0.2 µm although other thicknesses (e.g., ranging from 1.0-3.0 µm±0.2 µm) can be relied upon. The thickness of the intrinsic layer 116 can range to tune the electrical characteristics of the PIN diodes, such as the off-state capacitance, flat leakage characteristics in limiting mode, and maximum power handling capability, among other electrical characteristics.

The anode layer 118 (also "PIN anode layer 118") is formed on the intrinsic layer 116. The anode layer 118 can be formed of AlGaAs semiconductor material. In one case, the anode layer 118 can include 20% Al (i.e., $Al_{0.2}Ga_{0.8}As$), although other concentrations of Al (e.g., 18-22% Al or other ranges) can be used in the anode layer 118. The anode layer 118 can be doped with a P+-type dopant, such as Carbon (C) or other dopant, to a concentration of between $3 \times 10^{19}$ to $5 \times 10^{19}$ $cm^{-3}$. The anode layer 118 can be epitaxially grown, deposited, or otherwise formed to a thickness of 0.8 µm±0.1 µm, although other thicknesses can be relied upon. As noted above, the first cathode layer 114, intrinsic layer 116, and anode layer 118 provide a heterojunction for one or more PIN diodes.

The etch stop layer 120 is formed on or over the anode layer 118. The etch stop layer 120 can be formed of Indium Gallium Phosphorus (InGaP or $In_xGa_{1-x}P$) semiconductor material, although other material layers can be used for the etch stop layer 120. Overall, the material of the etch stop layer 120 can be selected for high etch selectivity as compared to the other layers in the stack of semiconductor material layers 110. Thus, the etch rate of the etch stop layer 120, as measured in Angstroms (Å)/second (s), nanometers (nm)/minute (m), microns (µm)/minute (m), or other metric, can be different than the etch rate of the other layers for a given wet etch chemistry. Thus, for example, selective etching of the second cathode layer 122 and the active layer 124 can be achieved using a first wet chemical etching process step and suitably halted or stopped when regions of those layers are removed, from the top down, to the etch stop layer 120. Similarly, the etch stop layer 120 can be removed down to the anode layer 118 with high selectivity, to preserve the anode layer 118.

In one case, the etch stop layer 120 can include 48.5% In (i.e., $In_{0.485}Ga_{0.515}P$), although other concentrations of In (e.g., 46-50% In or other ranges) can be used in the etch stop layer 120. The etch stop layer 120 can be doped with a P+-type dopant, such as Si or other dopant, to a concentration of between $1 \times 10^{18}$ to $2 \times 10^{18}$ $cm^{-3}$. The etch stop layer 120 can be epitaxially grown, deposited, or otherwise formed to a relatively thin thickness of 0.005 µm±0.0005 µm, although other thicknesses can be relied upon.

The second cathode layer 122 (also "Schottky cathode layer 124") is formed on or over the etch stop layer 120. The second cathode layer 122 can be formed of GaAs semiconductor material. The second cathode layer 122 can be doped with an N+-type dopant, such as Si or other dopant, to a concentration of between $2 \times 10^{18}$ to $4 \times 10^{18}$ cm$^{-3}$ in one example. The second cathode layer 122 can be epitaxially grown, deposited, or otherwise formed to a thickness of 2.0 µm±0.2 µm, although other thicknesses can be relied upon.

The active layer 124 (also "Schottky active layer 124") is formed on the second cathode layer 122. The active layer 124 can be formed of GaAs semiconductor material. The active layer 124 can be doped with an N+-type dopant, such as Si or other dopant, to a concentration tailored for certain electrical characteristics of Schottky diodes formed by the second cathode layer 122 and the active layer 124, such as off-state capacitance of the Schottky diodes. The active layer 124 can also be epitaxially grown, deposited, or otherwise formed over a range of thicknesses to tailor certain electrical characteristics of Schottky diodes, including off-state capacitance and other characteristics.

In one example, the active layer 124 can be doped with an N-type dopant such as Si or other dopant type to a concentration of between $1.1 \times 10^{17}$ to $1.3 \times 10^{17}$ cm$^{-3}$. In another example, the active layer 124 can be doped with Si or other dopant type to a concentration of between $1.0 \times 10^{16}$ to $1.4 \times 10^{16}$ cm$^{-3}$, for Schottky diodes of lower off-state capacitance values. Other dopant concentrations can be relied upon to tailor the off-state capacitance and other characteristics of the Schottky diodes described herein. In one example, the active layer 124 can be formed to a thickness of 0.23 µm±0.015 µm. In another example, the active layer 124 can be formed to a thickness of 0.6 µm±0.05 µm. Other thicknesses of the active layer 124 can be relied upon.

Among the layers 110, the active layer 124 is an active GaAs Schottky layer, and the second cathode layer 122 is an N+ doped GaAs cathode layer. Together, the layers 122 and 124 form a Schottky junction for one or more Schottky diodes. The first cathode layer 114, intrinsic layer 116, and anode layer 118 form a heterojunction for one or more PIN diodes.

Overall, the stack of semiconductor material layers 110, as illustrated in FIG. 3 and described above, is provided as a representative example of semiconductor material layers that can be used to form a MMIC including PIN diode and Schottky diodes, along with other passive electronic components, over the substrate 100. Variations in the materials, doping concentrations, and thicknesses of the layers can be relied upon in some cases. The stack of semiconductor material layers 110 can be manufactured or sourced separately, and step 300 can occur at a different time and place as compared to the remaining steps in FIG. 2 in some cases.

Figure 4:
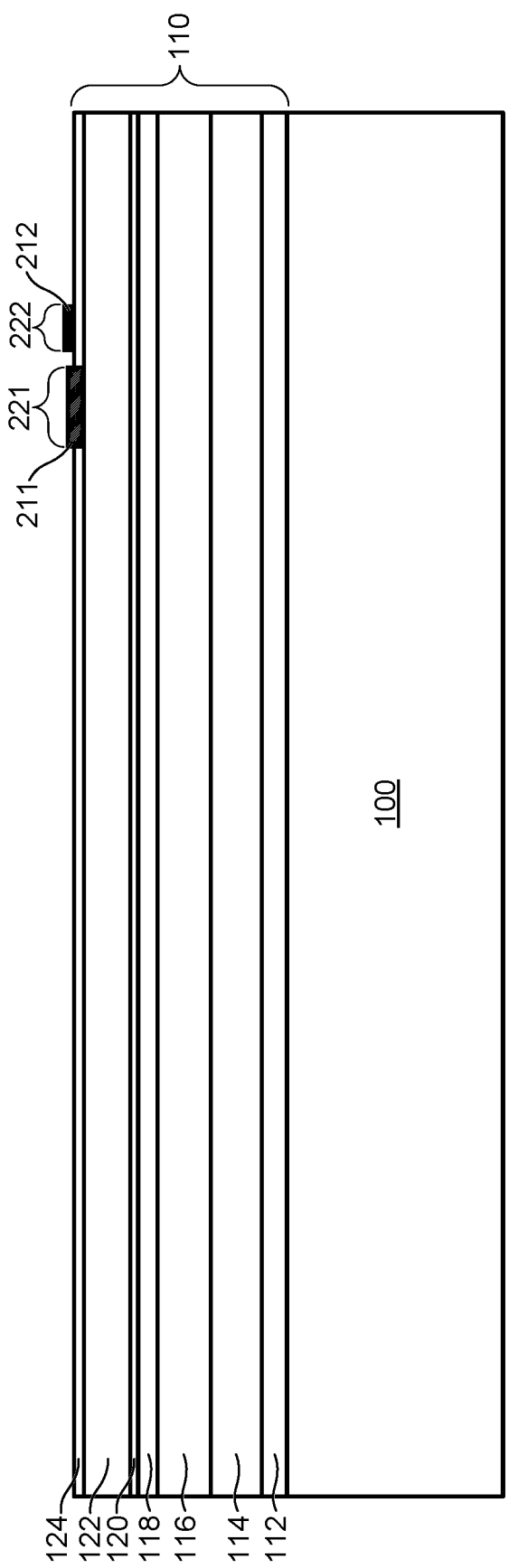
FIG. 4 illustrates forming Schottky diode contacts on a first subset of the semiconductor material layers shown in FIG. 3 according to various aspects of the examples described herein.

Step 302 in FIG. 2 includes forming Schottky diode contacts. More particularly, step 302 includes forming one or more cathode Ohmic contacts for Schottky diodes and forming one or more anode Schottky contacts for the Schottky diodes. Referring to FIG. 4 as an example, the cathode Ohmic contact 211 can be formed on the second cathode layer 122 and the anode Schottky contact 212 can be formed on the Schottky active layer 124. The cathode Ohmic contact 211 provides a cathode Ohmic contact for the Schottky diode 210, and the anode Schottky contact 212 provides an anode Schottky contact for the Schottky diode 210.

To form the diode Ohmic contact 211 on the second cathode layer 122, step 302 can include applying a photoresist layer over the stack of semiconductor material layers 110, patterning the photoresist layer, and selectively removing the photoresist layer in a contact region 221 for the diode Ohmic contact 211. Any photo imageable compound such as photoresist material can be used to pattern the device features for the purpose of etching or depositing metals. The process can also include etching the active layer 124 down to the top surface of the second cathode layer 122 in the contact region 221. The process can also include depositing one or more layers of metal on the second cathode layer 122 in the contact region 221, to form the cathode Ohmic contact 211. The process can also include lifting off or removing metal deposited outside of the contact region 221, by stripping the remaining photoresist and metal outside of the contact region 221 (e.g., lift-off) or other techniques.

The photoresist layer can be applied using any suitable technique, such as spin-on, spray-on, or other approaches. The photoresist layer can be patterned using a mask and energy source, such as an ultraviolet (UV) light source, electron beam exposure, or other energy source. Patterned areas or regions of the photoresist layer, such as the contact region 221 can be removed using a developer, and resist areas or regions can be removed using a solvent, as understood in the field. Various photoresist materials (e.g., including positive and negative photoresists) and approaches of applying photoresist, patterning, etching, depositing materials (e.g., one or more metal layers), and lifting-off materials are known in the field, and the cathode Ohmic contact 211 can be formed in the contact region 221 using a number of different photoresist patterning, etching, material deposit, and lift-off approaches. The other process steps described herein can also use other suitable approaches for selectively removing and depositing material layers, beyond the particular examples provided.

The cathode Ohmic contact 211 can include one or more layers of metal or metal alloys deposited at a suitable thickness. In one example, the cathode Ohmic contact 211 can include layers of Gold Germanium (AuGe) alloy, Nickel (Ni), and Au, although other metals and metal alloys can be relied upon. The cathode Ohmic contact 211 can be 0.33 µm±0.3 µm in thickness as one example, although other thicknesses can be relied upon. The cathode Ohmic contact 211 can be deposited by evaporating the layers of metal or metal alloys in one example, although sputtering and other physical vapor deposition techniques, chemical vapor deposition techniques, plating techniques, or other techniques can be relied upon.

Step 302 can also include annealing the cathode Ohmic contact 211. The cathode Ohmic contact 211 can be annealed to allow Ge from the cathode Ohmic contact 211 to drive further into the second cathode layer 122. This annealing results in a higher-doped local region of the second cathode layer 122 below the Ohmic metal of the cathode Ohmic contact 211, for lower bulk resistivity below the cathode Ohmic contact 211. The additional Ge doping in this local region also helps to make the Schottky barrier between the second cathode layer 122 and the cathode Ohmic contact 211 very thin, such that its series contribution to the contact resistance is small.

Step 302 can also include forming the anode Schottky contact 212. To form the anode Schottky contact 212 on the active layer 124, step 302 can also include applying a photoresist layer over the stack of semiconductor material layers 110 and the cathode Ohmic contact 211, patterning the photoresist layer, and selectively removing the photoresist layer in a contact region 222 for the anode Schottky contact 212. The process can also include depositing one or more layers of metal on the active layer 124 in the contact region 222, to form the anode Schottky contact 212 for the Schottky diode 210 (FIG. 1). The process can also include lifting off or removing any deposited metal outside of the contact region 222, by stripping away the remaining photoresist and metal outside of the contact region 222.

The anode Schottky contact 212 can include one or more layers of metal or metal alloys deposited at a suitable thickness. In one example, the anode Schottky contact 212 can include a layer of Titanium (Ti) and Platinum (Pt) alloy, although other metals and metal stacks can be relied upon. The anode Schottky contact 212 can be 0.2 µm±0.2 µm in thickness as one example, although other thicknesses can be relied upon. The anode Schottky contact 212 can be deposited by evaporating the layers of metal or metal stacks in one example, although sputtering and other physical vapor deposition techniques, chemical vapor deposition techniques, plating techniques, or other techniques can be relied upon.

Figure 5:
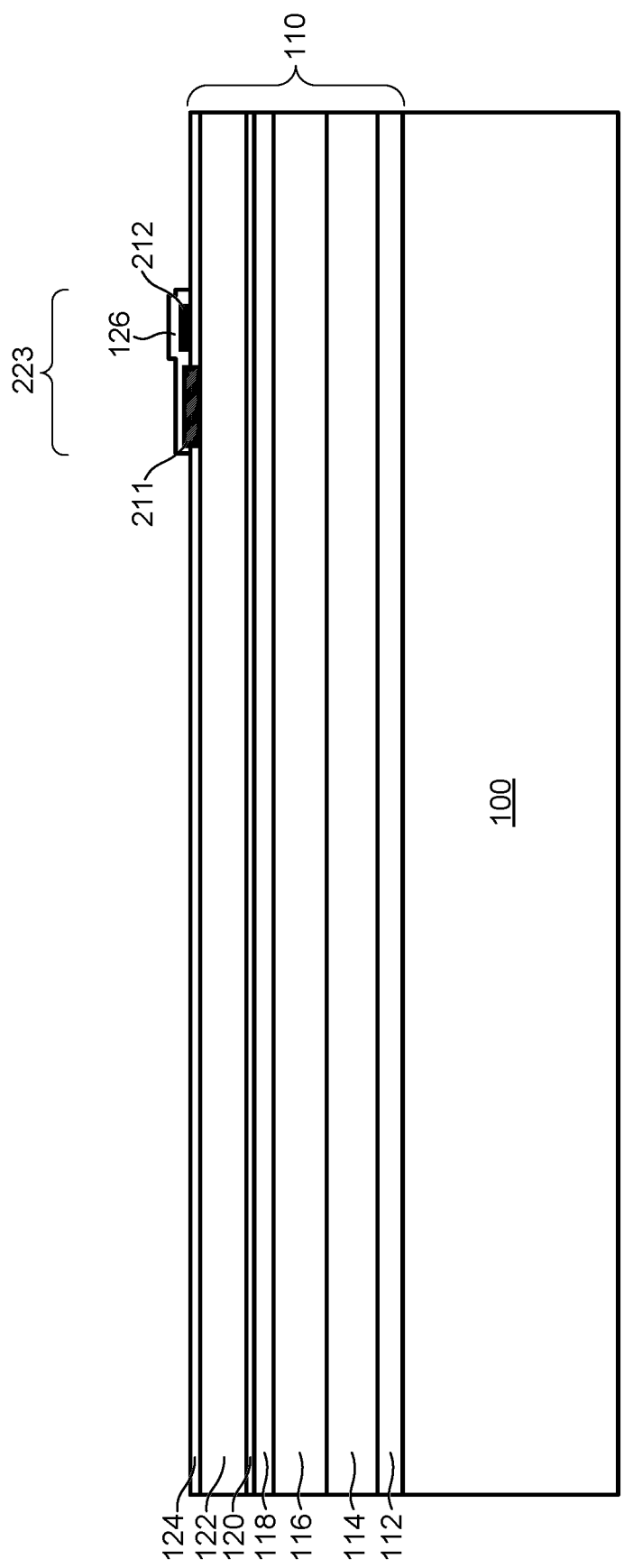
FIG. 5 illustrates passivating the Schottky diode contacts formed in FIG. 4 according to various aspects of the examples described herein.

Step 304 in FIG. 2 includes passivating the Schottky diode contacts. Referring to FIG. 5 for an example, step 304 can include forming a passivation layer 126 over the stack of semiconductor material layers 110 and the cathode and anode contacts 211 and 212. The passivation layer 126 can be formed out of Silicon Nitride (e.g., $Si_3N_4$) or any other adequate dielectric material to protect the anode Schottky contact 212 and cathode Ohmic contact 211 during subsequent process steps, including etching and lift-off steps. The passivation layer 126 can be formed using chemical vapor deposition techniques such as ALD (Atomic Layer Deposition) or PECVD (Plasma Enhanced Chemical Vapor Deposition), evaporation, spin coating, spray coating, or other technique.

At step 304, the process can also include removing the passivation layer 126 outside the region 223, as also shown in FIG. 5. Removing part of the passivation layer 126 can include applying a photoresist layer over the passivation layer 126, and patterning and selectively removing the photoresist layer outside of the region 223. The region 223 can include (e.g., cover, surround, or encompass) the cathode Ohmic contact 211 and the anode Schottky contact 212 for the Schottky diode 210, as shown in FIG. 5, for example. Step 304 can also include etching the passivation layer 126 away outside the region 223. The passivation layer 126 can also be selectively deposited in the region 223 using other process steps, as the sequence described above is provided as an example.

Figure 6:
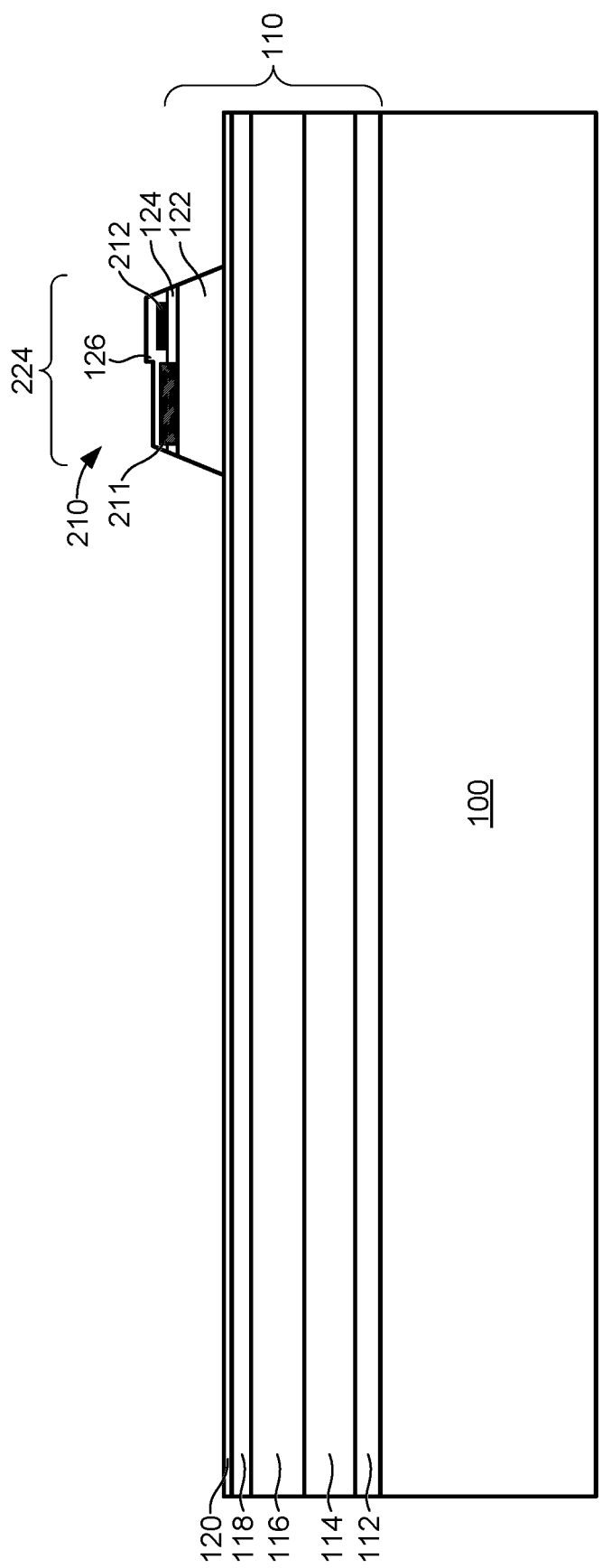
FIG. 6 illustrates etching down to the stop layer in the semiconductor material layers shown in FIG. 3 according to various aspects of the examples described herein.

Step 306 in FIG. 2 includes etching the active layer 124 and the second cathode layer 122 down to the etch stop layer 120, in an area outside of the region 224, as shown in FIG. 6. The region 224 can be isolated using photolithography, and the active layer 124 and second cathode layer 122 can be etched away down to the etch stop layer 120 using wet chemical etching, for example, although other etching techniques can be relied upon. The region 224 can be formed in a range of shapes (i.e., from a top-down view) and sizes. When considering various shapes, rounded corners may be preferred to avoid higher electric field intensities associated with sharp corners. The etch chemistry used in step 306 can etch the layers 122 and 124 down at a different, and faster, rate than the stop layer 120, so that the etching at step 306 can be selectively stopped at the stop layer 120.

Figure 7:
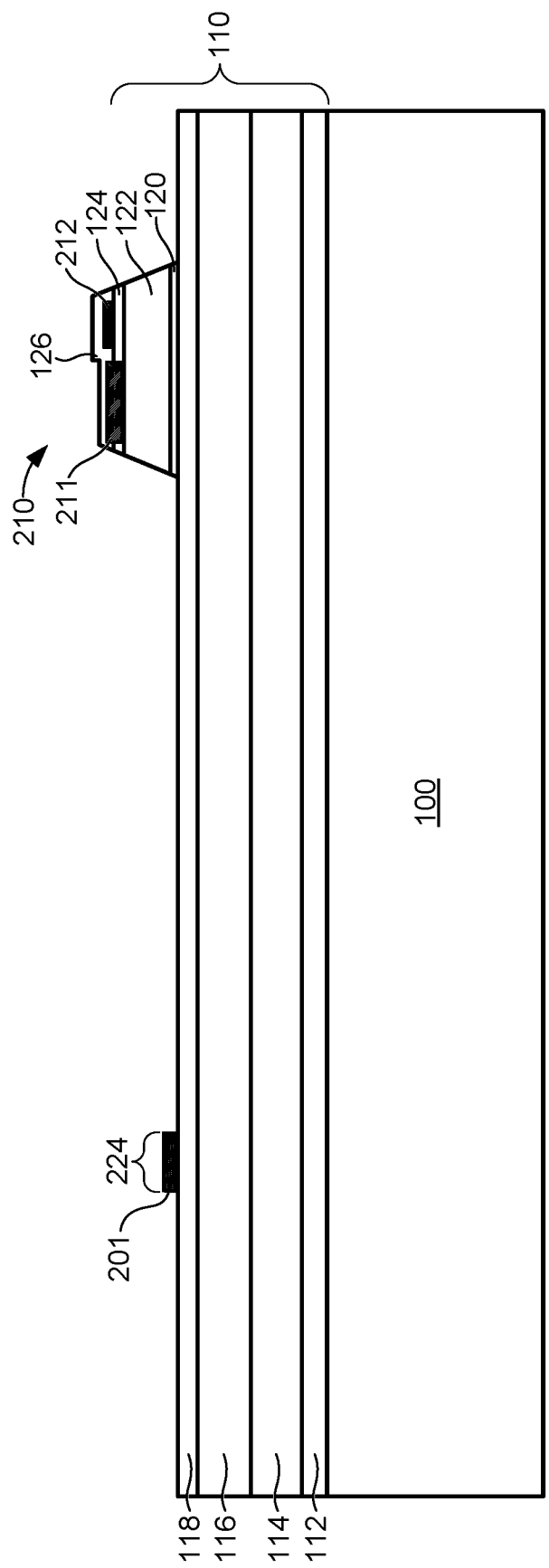
FIG. 7 illustrates removing the stop layer and forming PIN anode contacts on an anode layer among the semiconductor material layers shown in FIG. 3 according to various aspects of the examples described herein.

Step 308 can include removing regions of the stop layer. More particularly, the process can include removing or etching the stop layer 120 down to the anode layer 118, as shown in FIG. 7. The stop layer 120 can be etched down to the anode layer 118 in step 308 using a different technique than that used to etch the active layer 124 and the second cathode layer 122 down to the etch stop layer 120 in step 306. That is, different etch chemistries, techniques, or approaches can be relied upon in steps 306 and 308, as the etch selectivity is different in those steps. The material of the etch stop layer 120 can be selected for high etch selectivity as compared to the other layers in the stack of semiconductor material layers 110. This high selectivity can help to preserve the anode layer 118 as part of step 308.

Step 310 in FIG. 2 includes forming PIN diode anode contacts. Referring to FIG. 7 for an example, the anode Ohmic contact 201 of the PIN diode 200 (see FIG. 1) can be formed on the anode layer 118, among possibly other anode contacts for other PIN diodes. Forming PIN anode contacts can include applying a photoresist layer, patterning the photoresist layer, and selectively removing the photoresist layer in a contact region 224. The process can also include depositing one or more layers of metal on the anode layer 118 in the contact region 224, to form the anode Ohmic contact 201 for the PIN diode 200. The process can also include lifting off or removing metal deposited outside of the contact region 224, by stripping the remaining photoresist and metal outside of the contact region 224 (e.g., lift-off) or other techniques.

The anode Ohmic contact 201 can include one or more layers of metal or metal alloys deposited at a suitable thickness. In one example, the anode Ohmic contact 201 can include a metal stack of Pt/Ti/Pt, although other metals and metal stacks can be relied upon. The anode Ohmic contact 201 can be 0.26 µm±0.2 µm in thickness as one example, although other thicknesses can be relied upon. The anode Ohmic contact 201 can be deposited by evaporating the layers of metal or metal stacks in one example, although sputtering and other physical vapor deposition techniques, chemical vapor deposition techniques, plating techniques, or other techniques can be relied upon.

Figure 8:
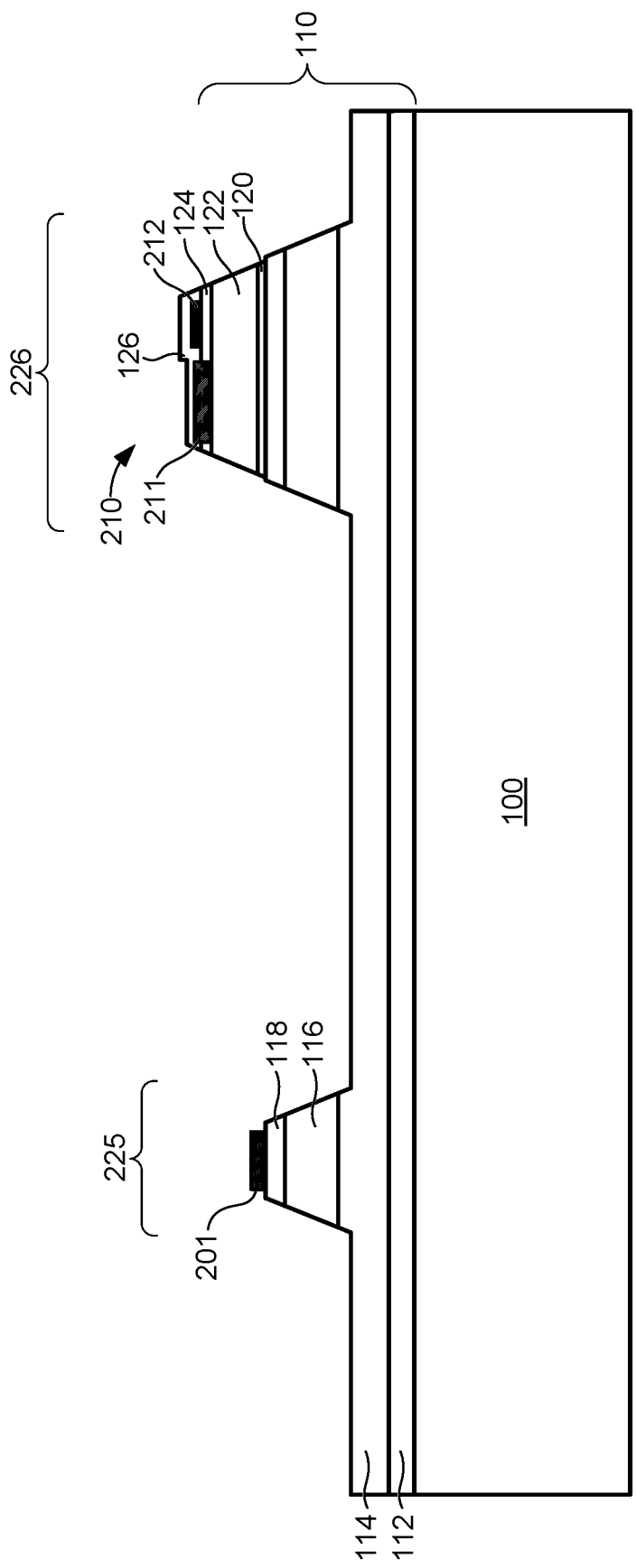
FIG. 8 illustrates exposing, in certain regions, a cathode layer among the semiconductor material layers shown in FIG. 3 according to various aspects of the examples described herein.

Step 312 in FIG. 2 includes exposing the first cathode layer 114 in certain regions. Referring to FIG. 8 for an example, step 310 can include etching through the anode layer 118 and the intrinsic layer 116 down to the first cathode layer 114, in an area outside the regions 225 and 226. To protect the device features formed in earlier steps, the etching can include applying a photoresist layer over the layers and contacts shown in FIG. 8, and patterning and selectively removing the photoresist layer outside of the regions 225 and 226. The region 225 can include (e.g., surround or encompass) the anode Ohmic contact 201, as shown in FIG. 7. The region 225 can be formed in a range of shapes (i.e., from a top-down view) and sizes. When considering various shapes, rounded corners may be preferred to avoid higher electric field intensities associated with sharp corners. The region 226 can include (e.g., surround or encompass) the mesa of the Schottky diode 210.

After the photoresist has been patterned to protect the regions 225 and 226, the etching can remove the anode layer 118 and the intrinsic layer 116 down to the first cathode layer 114. The etching can also remove a portion of the top surface of the first cathode layer 114. The anode layer 118 and the intrinsic layer 116 can be etched away using wet chemical etching, for example, although other etching techniques, including plasma etching, can be relied upon.

Figure 9:
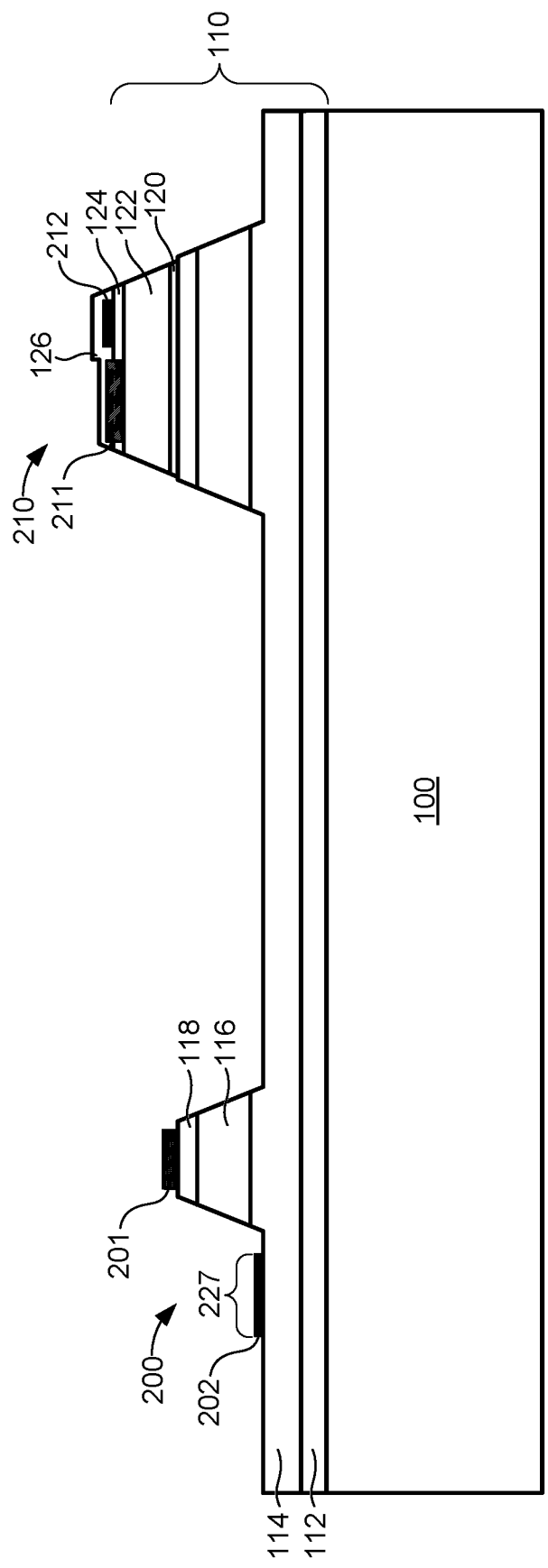
FIG. 9 illustrates forming PIN diode cathode contacts on a cathode layer among the semiconductor material layers shown in FIG. 3 according to various aspects of the examples described herein.

Step 314 in FIG. 2 includes forming PIN diode cathode contacts. Referring to FIG. 9, the cathode Ohmic contact 202 of the PIN diode 200 can be formed on the first cathode layer 114, among possibly other cathode Ohmic contacts for other PIN diodes. Forming PIN cathode contacts can include applying a photoresist layer, patterning the photoresist layer, and selectively removing the photoresist layer in a contact region 227. The process can also include depositing one or more layers of metal on the first cathode layer 114 in the contact region 227, to form the cathode Ohmic contact 202 for the PIN diode 200. The process can also include lifting off or removing metal deposited outside of the contact region 227, by stripping the remaining photoresist and metal outside of the contact region 226 (e.g., lift-off) or other techniques.

The cathode Ohmic contact 202 can include one or more layers of metal or metal alloys deposited at a suitable thickness. In one example, the cathode Ohmic contact 202 can include stacked layers of AuGe alloy, Ni, and Au, although other metals and metal alloys can be relied upon. The cathode Ohmic contact 202 can be 0.33 µm±0.3 µm in thickness as one example, although other thicknesses can be relied upon. The cathode Ohmic contact 202 can be deposited by evaporating the layers of metal or metal alloys in one example, although sputtering and other physical vapor deposition techniques, chemical vapor deposition techniques, plating techniques, or other techniques can be relied upon.

Step 314 can also include annealing the cathode contact 202. The cathode Ohmic contact 202 can be annealed to allow Ge from the cathode contact 202 to drive further into the first cathode layer 114. This annealing results in a higher-doped local region of the first cathode layer 114 below the Ohmic metal of the cathode contact 202, for lower bulk resistivity below the cathode contact 202.

Figure 10:
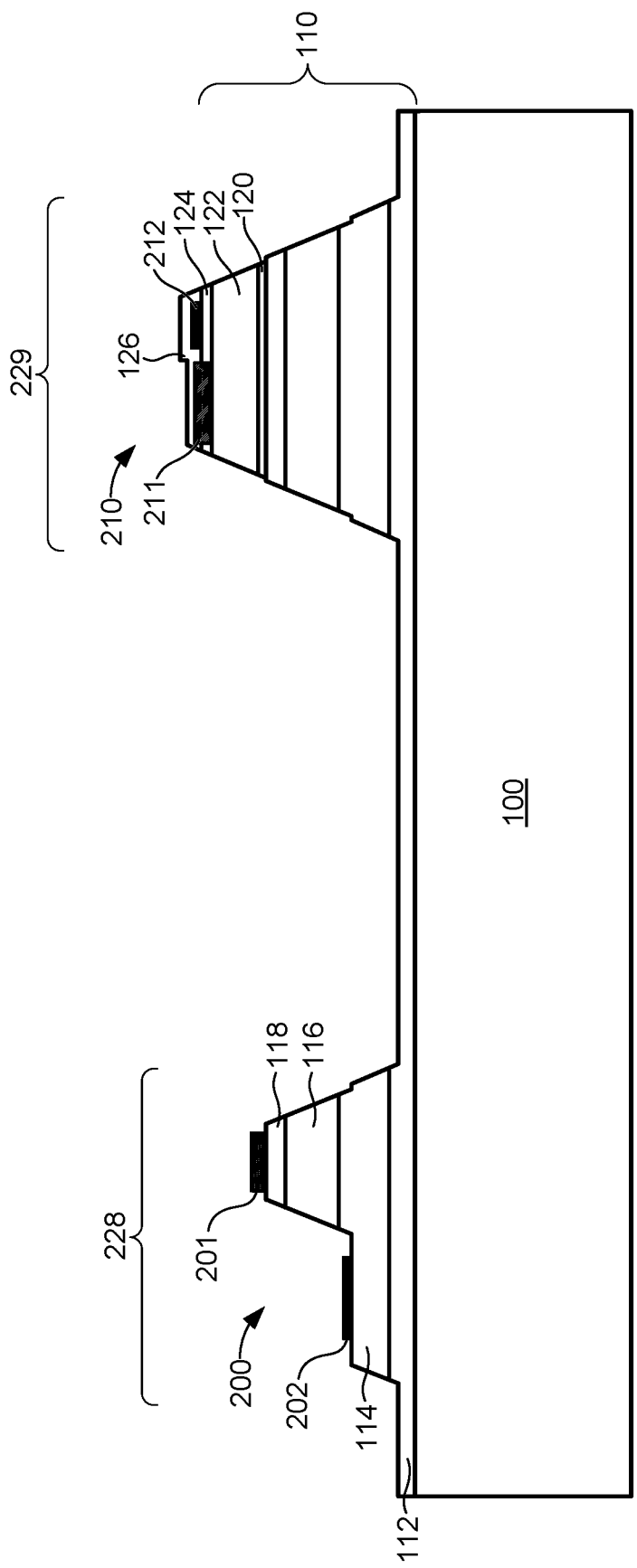
FIG. 10 illustrates isolating the PIN and Schottky diodes according to various aspects of the examples described herein.

Step 316 in FIG. 2 can include isolating the PIN and Schottky diodes from each other. Referring to FIG. 10 for an example, step 316 can include etching through the remainder of the first cathode layer 114 down into the buffer layer 112, in an area outside the regions 228 and 229. Photolithography can be used to protect the PIN diode 200 and the Schottky diode 210, among possibly others, in the regions 228 and 229. Thus, step 316 can include applying a photoresist layer over the layers and contacts shown in FIG. 10, and patterning and selectively removing the photoresist layer outside of the regions 228 and 229. After the photoresist has been selectively removed outside the regions 228 and 229, the first cathode layer 114 can be etched away down to the buffer layer 112. The etching can also remove a portion of the top surface of the buffer layer 112. The first cathode layer 114 and the buffer layer 112 can be etched away using wet chemical etching, for example, although other etching techniques can be relied upon.

Steps 310, 312, 314, and 316 can also be performed according to the methods described in U.S. Pat. No. 6,794,734, titled "Heterojunction P-I-N Junction Diode and Method of Making the Same," the entire contents of which is hereby incorporated herein by reference.

After the PIN diode 200 and the Schottky diode 210, among others, are formed over the substrate 100 (e.g., after step 316 in FIG. 2), one or more passive electrical components can also be formed over the substrate 100 in subsequent processing steps. The electrical components can include capacitors, resistors, inductors transmission lines, RF couplers, and other components. The electrical components can be electrically connected to each other, to the PIN diode 200, to the Schottky diode 210, and to other diodes formed over the substrate 100, to form a variety of MMIC circuits. Example electrical components are described below with reference to FIG. 11, although other components and arrangements of components are within the scope of the embodiments.

Figure 11:
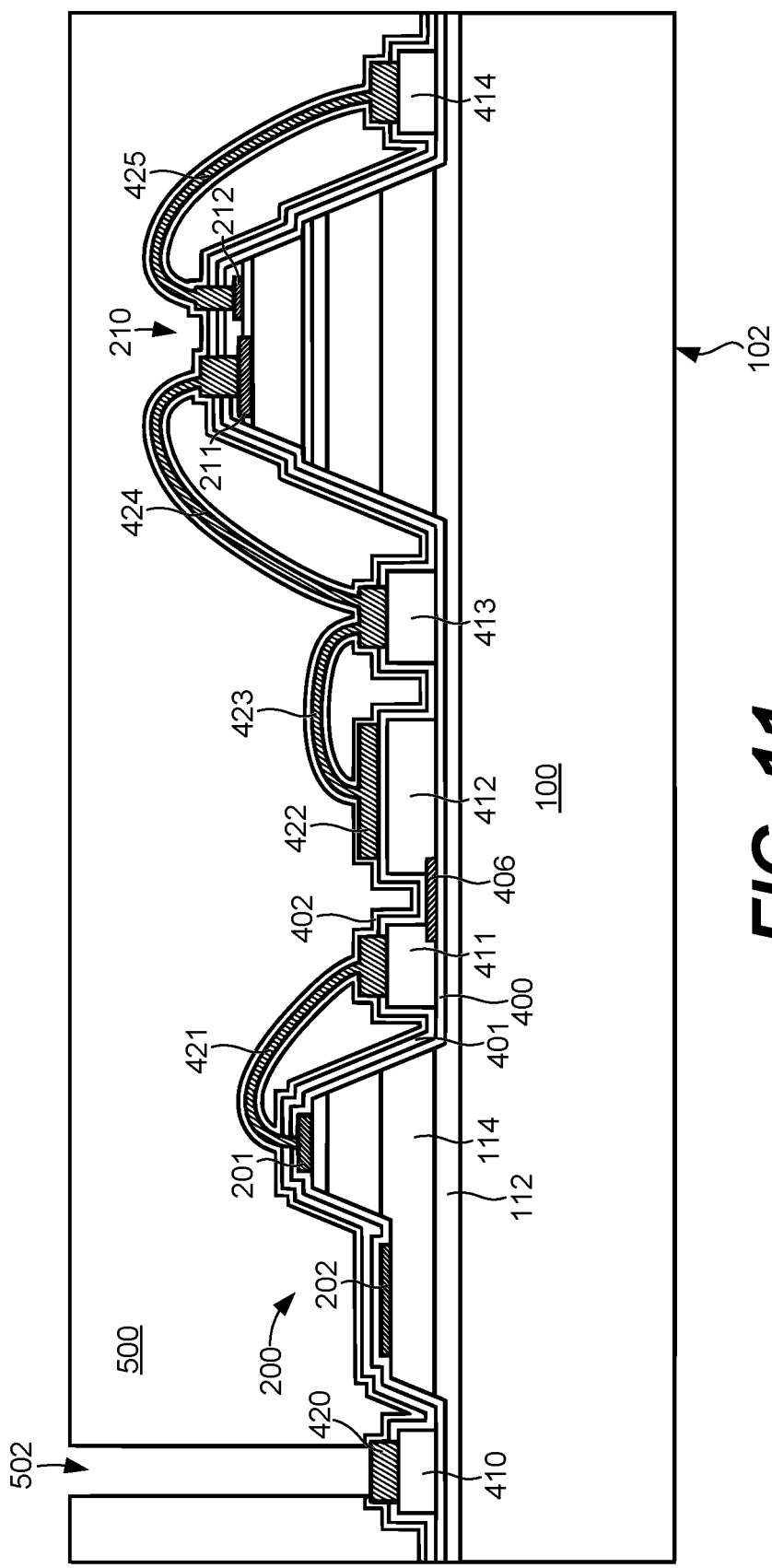
FIG. 11 illustrates a cross-sectional view of a passivated MMIC including PIN and Schottky diodes and electrical components coupled with the PIN and Schottky diodes according to various aspects of the examples described herein.

FIG. 11 illustrates a cross-sectional view of a passivated MMIC structure including PIN and Schottky diodes and electrical components coupled with the PIN and Schottky diodes according to various aspects of the examples described herein. FIG. 11 is provided as a representative example of passive electrical components formed over the substrate 100 and electrically connected to the PIN diode 200 and the Schottky diode 210. The features and elements shown in FIG. 11 are not necessarily drawn to scale. Additionally, other arrangements of components, including resistors, capacitors, inductors, transmission lines, RF couplers, and other elements can be formed, beyond the example provided in FIG. 11.

Step 318 in FIG. 2 includes forming a full passivation layer over the PIN diode 200 and the Schottky diode 210 over the substrate 100. Referring to FIG. 11 for an example, step 318 can include forming a passivation layer 400 over the PIN diode 200 and the Schottky diode 210. The passivation layer 400 can be formed out of $Si_3N_4$ or any suitable dielectric material to protect and further isolate the PIN diode 200 and the Schottky diode 210 from each other. The passivation layer 400 can be formed using chemical vapor deposition techniques such as ALD or PECVD, evaporation, spin coating, spray coating, or other technique.

Step 320 in FIG. 2 includes forming one or more resistive layer regions. For example, the resistive layer region 406 can be formed over the passivation layer 400, as shown in FIG. 11, using photolithography. The resistive layer region 406 can be formed by the evaporation and lift-off of Nickel Chromium (NiCr) metal alloy, although other resistive metallic alloys can be relied upon. The resistive layer region 406 is provided as one example, and other resistive layers or regions can also be formed at other locations over the passivation layer 400.

Step 322 in FIG. 2 includes forming features of a first metal layer. The first metal layer can be formed over the passivation layer 400. Areas or regions of the first metal layer can also be formed over the resistive layer region 406 in some cases. The first metal layer can be patterned using photolithography into a number of different electrical traces and components, such as inductors, transmission lines, RF couplers, metal interconnects, bottom layers of MIM capacitors, and related metal features. The first metal layer can be formed by the evaporation and lift-off of a metal, a metal alloy, or stacks of metals and metal alloys. In one example, the first metal layer can be formed by the evaporation of layers of Ti, Pt, Au, and Ti, deposited in a stack, although other metals, metal alloys, and stacks of metals and metal alloys can be used. The first metal layer can be formed to a thickness of 2.73 µm±0.1 µm as one example, although other thicknesses can be relied upon.

As shown in FIG. 11, the first metal layer has been patterned into the metal features 410-414. As examples, the metal feature 410 can be a metal interconnect, and the metal feature 411 can be formed as another metal interconnect. The metal feature 411 is formed in part on and over (and is electrically connected to) the resistive layer region 406. The metal feature 411 is also electrically connected to the PIN anode contact 201 by the metal feature 421, as described below. The metal feature 412 is formed in part on and over (and is electrically connected to) the resistive layer region 406. The metal feature 412 is also formed as a plate and forms the bottom layer (i.e., first capacitive plate) of a MIM capacitor, as described in further detail below. The metal feature 413 can be formed as an interconnect, inductor, transmission line, or RF coupler, as examples. The metal feature 413 is also electrically connected to the cathode Ohmic contact 211 by the metal feature 424, as described below. The metal feature 414 can be formed as an interconnect, inductor, transmission line, or RF coupler, as examples. The metal feature 414 is also electrically connected to the anode Schottky contact 212 by the metal feature 425, as described below.

Step 324 in FIG. 2 includes forming a passivation layer over the first metal layer. Referring to FIG. 11 for an example, step 324 can include forming another passivation layer 401 over the PIN diode 200 and the Schottky diode 210. The preliminary function of the passivation layer 401 is to form the insulation layer of a MIM capacitor as shown in FIG. 11, with the stack up of MIM capacitor bottom plate 412, insulator layer 401 and as subsequently described, MIM capacitor top plate 422. Step 324 can also include forming a passivation layer over the resistive layer region 406 and the metal features 410-414. The passivation layer 401 can include a layer of $Si_3N_4$, for example, although other protecting and insulating layers formed using the techniques described herein can be relied upon.

Step 326 in FIG. 2 includes forming features of a second metal layer. The second metal layer can be formed over the passivation layer 401 and relied upon primarily for electrically coupling contacts, traces, and other circuit elements together. The second metal layer can be patterned using photolithography into a number of conductive traces and components, as described in further detail below. Photolithographic steps can be relied upon to pattern and form the second metal layer. For example, photolithographic steps can be relied upon to open certain contact regions through the passivation layer 401, such as a contact regions over the metal features 410, 411, 413, and 414. Additionally, one or more process steps using a thick photoresist layer (e.g., between 6-10 µm thick) can also be relied upon to bridge regions of the second metal layer, such as between certain contacts, as also described below. The second metal layer can be formed by the evaporation and lift-off of a metal, a metal alloy, or stacks of metals and metal alloys. In one example, the second metal layer can be formed by the evaporation of layers of Ti, Pt, Au, and Ti, deposited in a stack, although other metals, metal alloys, and stacks of metals and metal alloys can be used. The second metal layer can be formed for example to a thickness of 2.73 µm±0.1 µm as one example, although other thicknesses can be relied upon.

As shown in FIG. 11, the second metal layer has been patterned into the metal features 420-425. As examples, the metal feature 420 can be a metal interconnect or contact. The metal feature 421 can be formed as an air bridge between the PIN anode contact 201 and the metal feature 411. The metal feature 422 is formed as a plate over metal feature 412 and forms the top layer (i.e., second capacitive plate) of a MIM capacitor. The passivation layer 401 acts as an insulator between the metal features 412 and 422, and a MIM capacitor is formed between The metal feature 422 is also electrically connected to the metal feature 413 by the air bridge 423. The metal feature 424 is formed as an air bridge between the metal feature 413 and the cathode Ohmic contact 211. The metal feature 425 also forms an air bridge between the anode Schottky contact 212 and the metal feature 414.

Step 328 in FIG. 2 includes forming a passivation layer over the second metal layer. Referring to FIG. 11 for an example, step 328 can include forming a passivation layer 402 over the metal features 420-425. The passivation layer 402 can include a relatively thick layer of $Si_3N_4$, among other passivation layer materials described herein. As an example, the thickness of the passivation layer 402 can be 6000 Angstrom but other thickness may be considered. In some regions, the passivation layer 402 can be formed over the passivation layers 400 and 401. The passivation layer 402 can also help to act as a moisture barrier.

Step 330 in FIG. 2 includes forming an encapsulant 500 over and around the PIN diode 200, the Schottky diode 210, the metal features 410-414, the metal features 420-425, and the consecutive layers of passivation 400-402. The encapsulant 500 can include a layer of Benzocyclobutene (BCB) of about 12 um thick, although other encapsulants and thicknesses can be relied upon. The encapsulant 500 can be formed or applied by spin coating or any other suitable application technique. The encapsulant 500 provides scratch protection and underfills (i.e., supports) air spans under the metal air-bridge features 421-425, among others. In that way, the encapsulant 500 helps to avoid collapse of the metal air-bridge features 421-425, when the MMIC is being manipulated and packaged. The encapsulant 500 can be formed on the entire area of the die including the PIN diode 200, the Schottky diode 210, and related components of the MMIC, except for on bonding or access pads and dicing streets on the wafer. Step 330 can also include forming the BCB opening 502 through the encapsulant 500. The BCB opening 502 can be formed using photo sensitive encapsulant or etching or other suitable technique for defining the opening. The BCB opening 502 provides an access for an electrical connection to be established with the top surface of the metal feature 420. Such electrical connection can be formed by a plating or other metal deposition process to form a z-direction vertical conductive via or by bonding of a gold bond or ribbon wire.

Step 332 in FIG. 2 includes adhering a supporting substrate to a top surface of the MMIC. For example, the supporting substrate 600 can be adhered to the outer or top surface of the encapsulant 500, and the MMIC can be supported using the substrate 600, while a number of backside processing steps are performed. The back or bottom surface 102 of the substrate 100 (see FIGS. 3 and 11) can be further processed in later process steps, after the supporting substrate 600 is mounted over the encapsulant 500.

Step 334 in FIG. 2 includes thinning a backside of the substrate 100. The back or bottom surface 102 of the substrate 100 can be thinned by mechanical grinding, wet chemical etching or polishing, or other thinning means. Step 336 in FIG. 2 includes forming a via 602 from the bottom surface 102 of the substrate 100, through the substrate 100 and through the buffer layer 112, to establish an electrical connection with one of the metal stacks previously formed. The via 602 can be relied upon when a connection with the back side metallization 604, as described below, is needed, such as for grounding purpose. As an example, the via 602 can be formed through the first cathode layer 114, and to the bottom surface of the PIN diode cathode contact 202, to electrically connect the PIN diode cathode to the back side metallization 604, to realize a PIN shunt diode for example. In that example, via 602 can be formed according to the method described in U.S. Pat. No. 11,270,928, titled "Unibody Lateral Via," which is hereby incorporated herein by reference in its entirety.

The via 602 can also be formed to the diode Ohmic cathode contact 211, as another example, to form a Schottky diode in a shunt configuration. If there is a need to connect any of the MMIC components (e.g., resistors, capacitors, inductors, transmission lines, RF couplers, and other components) to the back side metallization 604, the via 602 can be formed through the passivation layer 400 to electrically connect the metal features 410-414. The via 602 can be formed by any suitable etching techniques, such as reactive ion etching, wet etching, dry etching and plasma etching. Step 336 in FIG. 2 also includes plating the inner surfaces of the via 602 and the bottom surface 102 of the substrate 100 with the back side metallization 604. The back side metallization 604 can act as a ground layer in some cases, providing an electrical connection to the PIN cathode contact 202, to the cathode Ohmic contact 211, or any of the MMIC components developed. The back side metallization 604 can be formed as a number of layers of metal. In one example, the metal layer 604 can be formed by sputtering one or more seed layers of metal, such as Au, followed by evaporating Ti, Pt, and Au layers. Other layers of metal or metal alloys can be relied upon for the back side metallization 604.

Step 338 in FIG. 2 includes removing the supporting substrate 600 from the encapsulant 500, cleaning the MMIC (e.g., resist striping, plasma stripping, etc.), separating the substrate 100 into individual MMIC die, inspecting, and testing the MMIC devices.

Overall, the process flow diagram in FIG. 2 and processing steps shown in FIGS. 3-12 are provided as an example approach for forming MMIC devices including one or more PIN diodes in series and shunt configurations, one or more Schottky diodes in series and shunt configurations, and a variety of electrical components interconnected among them in a monolithic format. Variations on the process flow and steps are within the scope of the embodiments. As just one example, the PIN diode 200 can also be formed as a NIP diode, by reversing the materials of the layers 114 and 118. The MMIC devices can be configured and designed into a variety of circuit applications, by tailoring the electrical components and interconnections among the PIN and Schottky diodes.

The MMIC devices can incorporate passive electrical components to facilitate the fabrication of hybrid MMIC limiters and other circuit configurations. As examples, the Schottky-enhanced PIN diode limiters described below benefit from enhanced leakage characteristics and higher handling power capability than other PIN diode limiters. They offer greater small signal performance, higher frequency of operation, and lower cost than discrete hybrid limiters. Example circuit schematic diagrams and layouts for Schottky-enhanced PIN diode limiters are provided in FIGS. 13-19 and described below.

Figure 13:
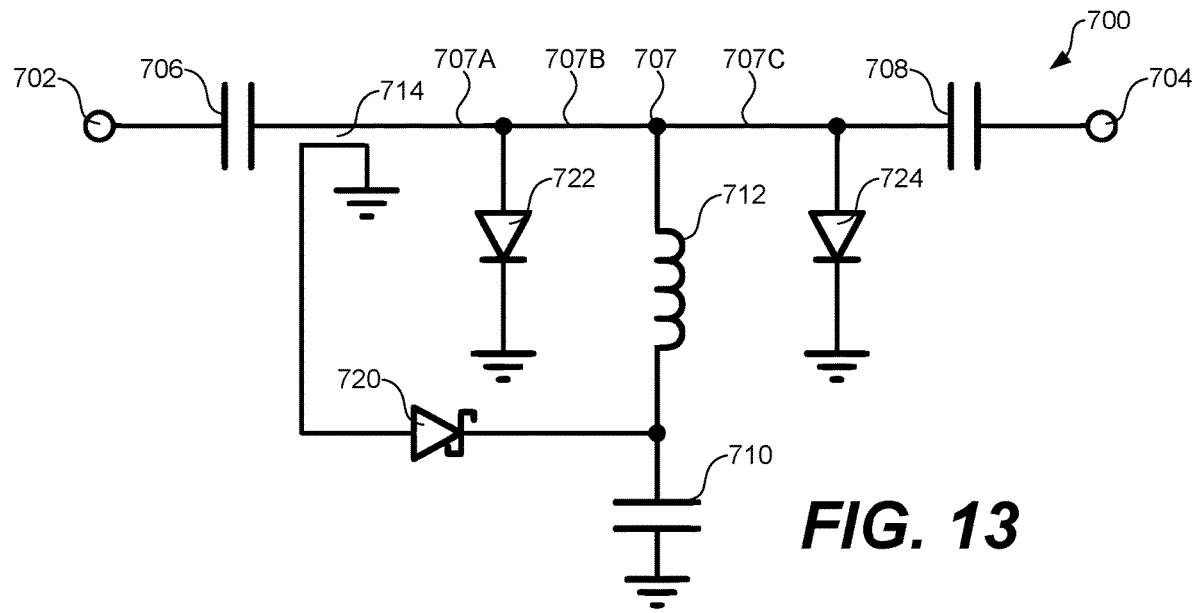
FIG. 13 illustrates a circuit schematic of a MMIC two-stage Schottky-enhanced limiter according to various aspects of the examples described herein.

FIG. 13 illustrates a circuit schematic of a MMIC two-stage Schottky-enhanced limiter 700 ("MMIC 700"). The MMIC 700 includes an input terminal 702 and an output terminal 704. The MMIC 700 also includes capacitors 706, 708, and 710, an inductor 712, and an RF coupler 714. The MMIC 700 also includes a Schottky diode 720 and PIN diode limiters 722 and 724. The Schottky diode 720 acts as a feedback Schottky diode. Combined with the RF coupler 714, the Schottky diode 720 forms a Schottky detector. A node 707 is positioned between the capacitors 706 and 708, which provide DC isolation at the input terminal 702 and the output terminal 704, respectively. The inductor 712 is connected between the node 707 and the capacitor 710, and the capacitor 710 is connected between the inductor 712 and ground. The PIN diode limiter 722 is connected between the transmission line 707A and ground on one side of the inductor 712. The PIN diode limiter 724 is connected between the transmission line 707B and ground on another side of the inductor 712. The RF coupler 714 extends along the transmission line 707A. The cathode of the Schottky diode 720 is connected to the RF coupler 714, and the anode of the Schottky diode 720 is connected to a node between the inductor 712 and the capacitor 710.

The components of the MMIC 700, including the Schottky diode 720 and the PIN diodes limiters 722 and 724, can be formed together over a common substrate according to the techniques described herein. For example, the capacitors 706, 708, and 710 can be MM capacitors formed between the first and second metal layers, with a passivation layer formed between them, as described above. The inductor 712 and the RF coupler 714 can be formed by patterning the first and second metal layers using photolithography. The Schottky diode 720 can be formed according to the process described above for the Schottky diode 210, and the PIN diode limiters 722 and 724 can be formed according to the process described above for the PIN diode 200.

Figure 14:
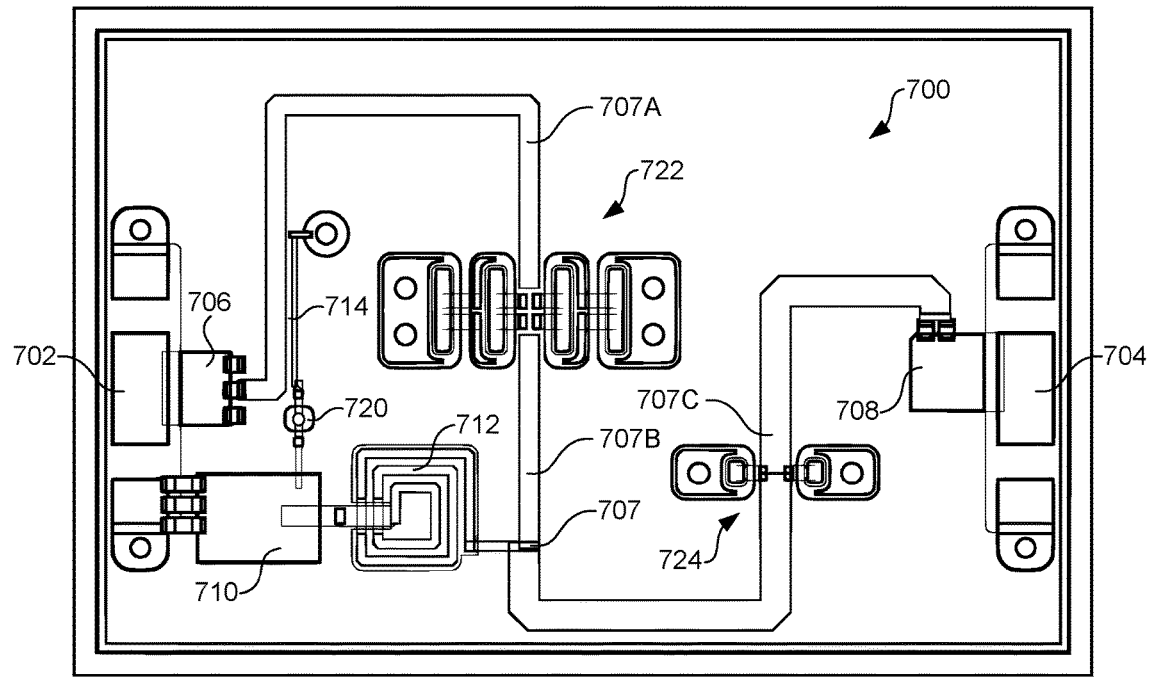
FIG. 14 illustrates a layout of the MMIC two-stage Schottky-enhanced limiter shown in FIG. 13 according to various aspects of the examples described herein.

FIG. 14 illustrates a layout of the MMIC 700 shown in FIG. 13 according to various aspects of the examples described herein. The PIN diode limiter 722 is connected from a first transmission line 707A to ground on one side of the node 707, and the PIN diode limiter 722 is connected from a transmission line 707C to ground on another side of the node 707. An impedance transition can occur between the transmission lines 707A and 707C at the node 707 via a transmission line 707B. As shown in FIG. 14, the PIN diode limiter 722 is implemented as a series-connected PIN diode connected to a shunt-connected PIN diode, on both sides of the transmission line 707A to ground. The PIN diode limiter 724 is implemented as a shunt-connected PIN diode, on both sides of the transmission line 707B to ground.

Figure 15:
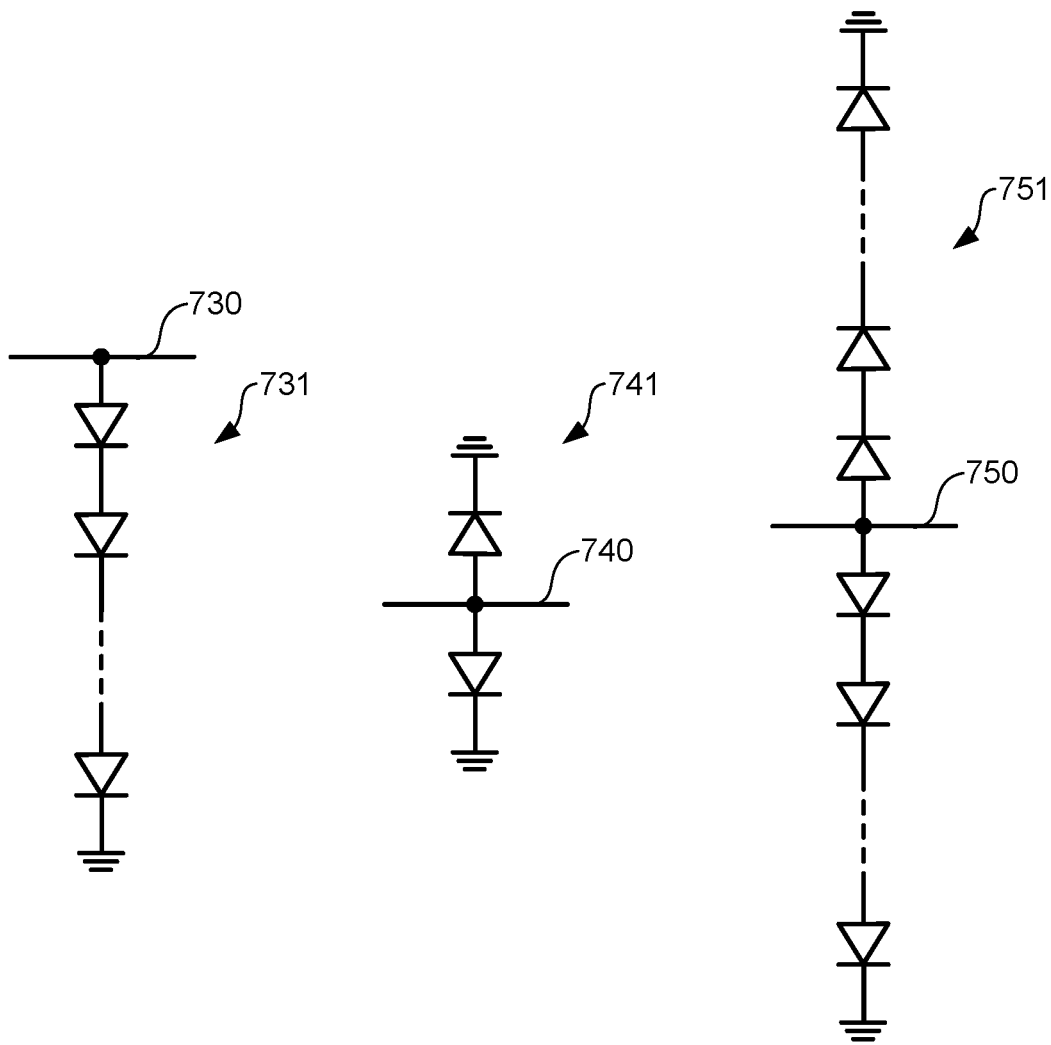
FIG. 15 illustrates a circuit schematic of various series and shunt connected diodes that can be relied upon in the MMIC Schottky-enhanced limiters according to various aspects of the examples described herein.

FIG. 15 illustrates a circuit schematic of various PIN diode limiters or limiting assemblies 731, 741, and 751 formed by a combination of series and shunt PIN diodes that can be relied upon in the MMIC Schottky-enhanced limiters described herein. For example, any of the PIN diode limiters or limiting assemblies 731, 741, and 751 can be relied upon as the PIN diode limiters 722 and 724 in FIG. 13. Any of the PIN diode limiters or limiting assemblies 731, 741, and 751 can also be relied upon as the PIN diode limiters 822 and 824 in FIG. 16, as well as the PIN diode limiters shown in FIGS. 18 and 19. In other cases, the PIN diode limiters in FIGS. 13, 16, 18, and 19 can also be embodied as a single PIN diode limiter, rather than an assembly, group, or string of PIN diodes.

The PIN diode assembly 731 includes a string of series-connected diodes, followed by a shunt-connected diode, from the node 730 to ground. Any number of diodes can be used in the string of series-connected diodes in the PIN diode assembly 731, including two, three, four, or more PIN diodes, followed by a shunt-connected diode to ground. The PIN diode assembly 741 includes a pair of two shunt-connected diodes, each connected from the node 740 to ground. The PIN diode assembly 751 includes a pair of the PIN diode assemblies 731, each connected from the node 750 to ground and interconnected in parallel with each other. In one example, the PIN diode limiter 724 in FIGS. 13 and 14 is implemented in a way that is similar to the PIN diode assembly 741. The arrangements of the series- and shunt-connected diodes in the PIN diode assemblies 731, 741, and 751, among other arrangements, can be realized over a common substrate according to the concepts described herein. In the MMIC limiters described herein, the arrangements of PIN diode assemblies 731, 741, and 751 can be tailored or selected based on the desired performance and trade-off between small-signal response, flat leakage, and maximum power handling capability, among other characteristics.

Figure 16:
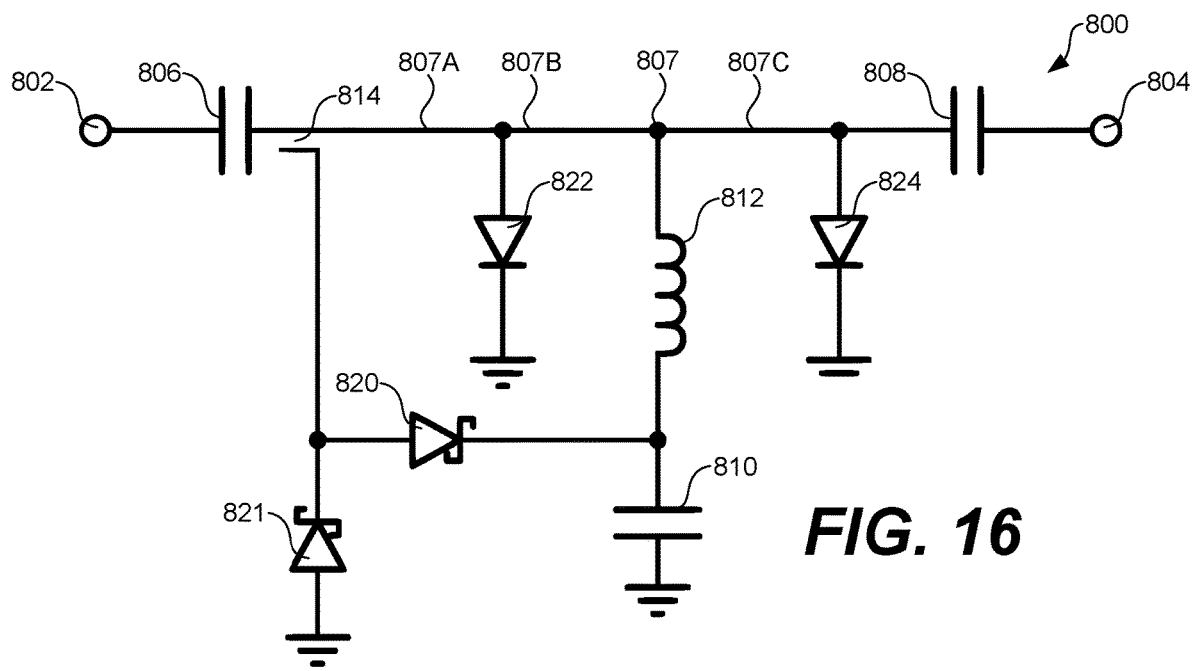
FIG. 16 illustrates another circuit schematic of a MMIC two-stage Schottky-enhanced limiter according to various aspects of the examples described herein.

FIG. 16 illustrates another circuit schematic of a MMIC two-stage Schottky-enhanced limiter ("MMIC 800"). The MMIC 800 includes an input terminal 802 and an output terminal 804. The MMIC 800 also includes capacitors 806, 808, and 810, an inductor 812, and an RF coupler 814. The MMIC 800 also includes Schottky diodes 820 and 821 and PIN diode limiters 822 and 824. The Schottky diode 820 acts as a feedback Schottky diode. The Schottky diode 821 acts as a DC ground return Schottky diode. Together with the RF coupler 814, the Schottky diodes 820 and 821 form a Schottky detector. A node 807 is positioned between the capacitors 806 and 808, which provide DC isolation at the input terminal 802 and the output terminal 804, respectively. The inductor 812 is connected between the node 807 and the capacitor 810, and the capacitor 810 is connected between the inductor 812 and ground. The PIN diode limiter 822 is connected between the transmission line 807A and ground on one side of the inductor 812. The PIN diode limiter 824 is connected between the transmission line 807C and ground on another side of the inductor 812. The RF coupler 814 extends along the transmission line 807A. The anode of the Schottky diode 820 is connected to the RF coupler 814, and the cathode of the Schottky diode 820 is connected to a node between the inductor 812 and the capacitor 810. The anode of the Schottky diode 821 is connected to ground, and the cathode of the Schottky diode 821 is connected to a node between the anode of the Schottky diode 820 and the RF coupler 814.

The components of the MMIC 800, including the Schottky diodes 820 and 821 and the PIN diode limiters 822 and 824, can be formed together over a common substrate according to the techniques described herein. For example, the capacitors 806, 808, and 810 can be MIM capacitors formed between the first and second metal layers, with a passivation layer formed between them, as described above. The inductor 812 and the RF coupler 814 can be formed by patterning the first and second metal layers using photolithography. The Schottky diodes 820 and 821 can be formed according to the process described above for the Schottky diode 210, and the PIN diode limiter 822 and 824 can be formed according to the process described above for the PIN diode 200.

Figure 17:
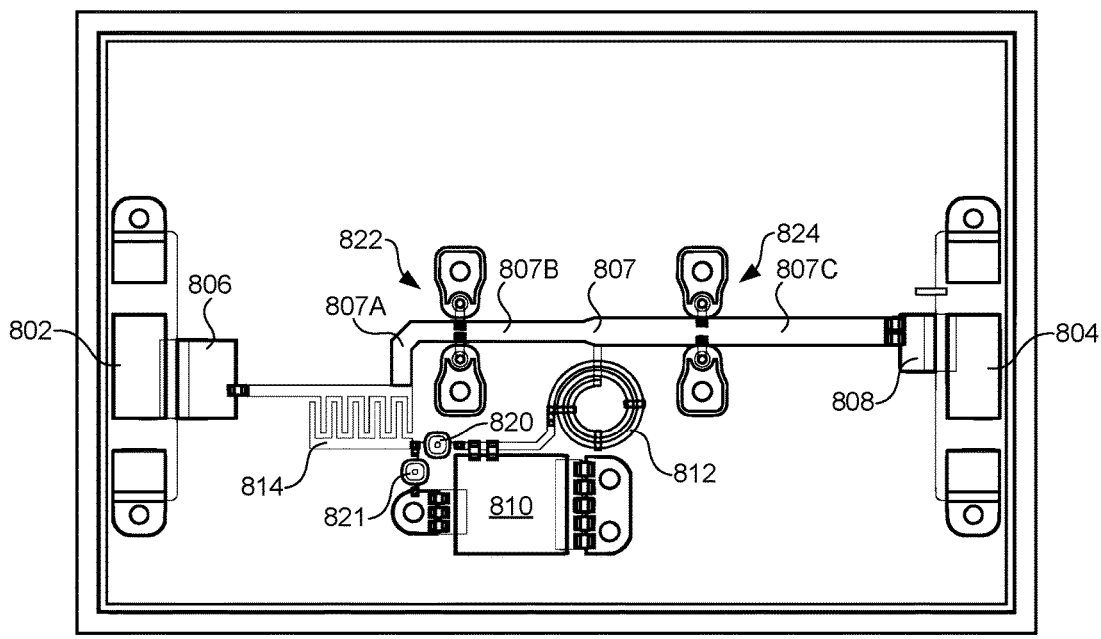
FIG. 17 illustrates a layout of the MMIC two-stage Schottky-enhanced limiter shown in FIG. 16 according to various aspects of the examples described herein.

FIG. 17 illustrates a layout of the MMIC 800 shown in FIG. 16 according to various aspects of the examples described herein. The PIN diode limiter 822 is connected from a first transmission line 807A to ground on one side of the node 807, and the PIN diode limiter 824 is connected from a transmission line 807C to ground on another side of the node 807. An impedance transition can occur within the transmission lines 807B at the node 807. As shown in FIG. 17, the PIN diode limiter 822 is implemented as a pair of shunt-connected PIN diodes in parallel configuration, on both sides of the transmission line 807A to ground. The PIN diode limiter 824 is also implemented as a pair of shunt-connected PIN diodes, on both sides of the transmission line 807B to ground.

Figure 18:
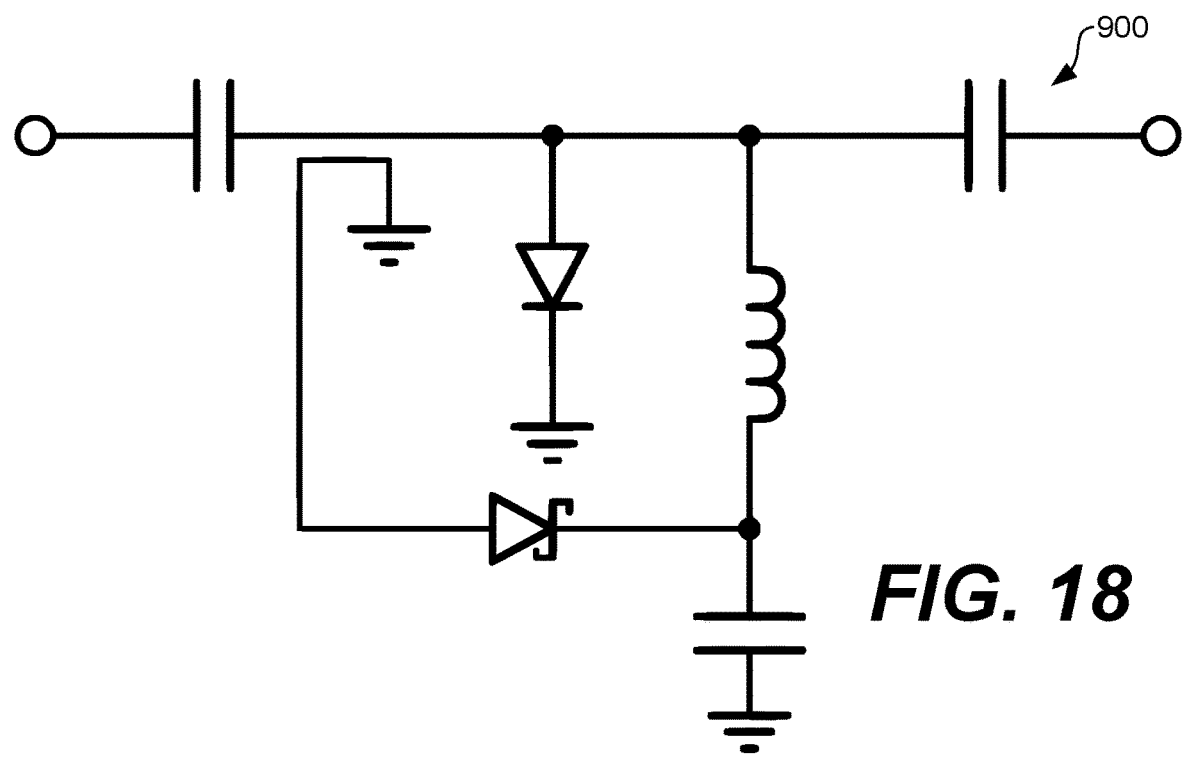
FIG. 18 illustrates a circuit schematic of a single-stage MMIC Schottky-enhanced limiter according to various aspects of the examples described herein.
Figure 19:
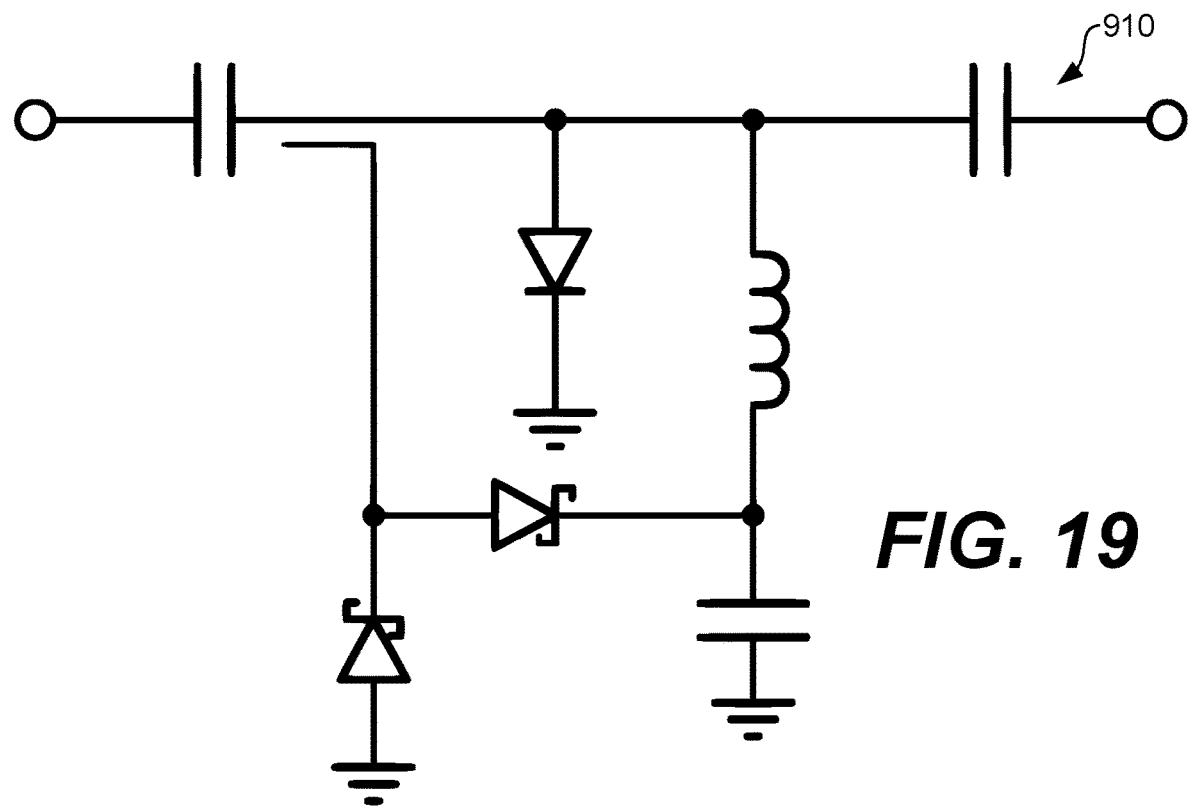
FIG. 19 illustrates a circuit schematic of another single-stage MMIC Schottky-enhanced limiter according to various aspects of the examples described herein.

FIG. 18 illustrates a circuit schematic of a single-stage MMIC Schottky-enhanced limiter 900 ("MMIC 900") according to other examples described herein, and FIG. 19 illustrates a circuit schematic of another single-stage MMIC Schottky-enhanced limiter 910 ("MMIC 910") according to other examples. The MMICs 900 and 910 are similar to the MMIC 700 shown in FIG. 13 and the MMIC 800 shown in FIG. 16, respectively, although the MMICs 900 and 910 include only one limiting stage that may include a single PIN diode limiter or one of the PIN diode limiter assemblies 731, 741, or 751 shown in FIG. 15.

Figure 20:
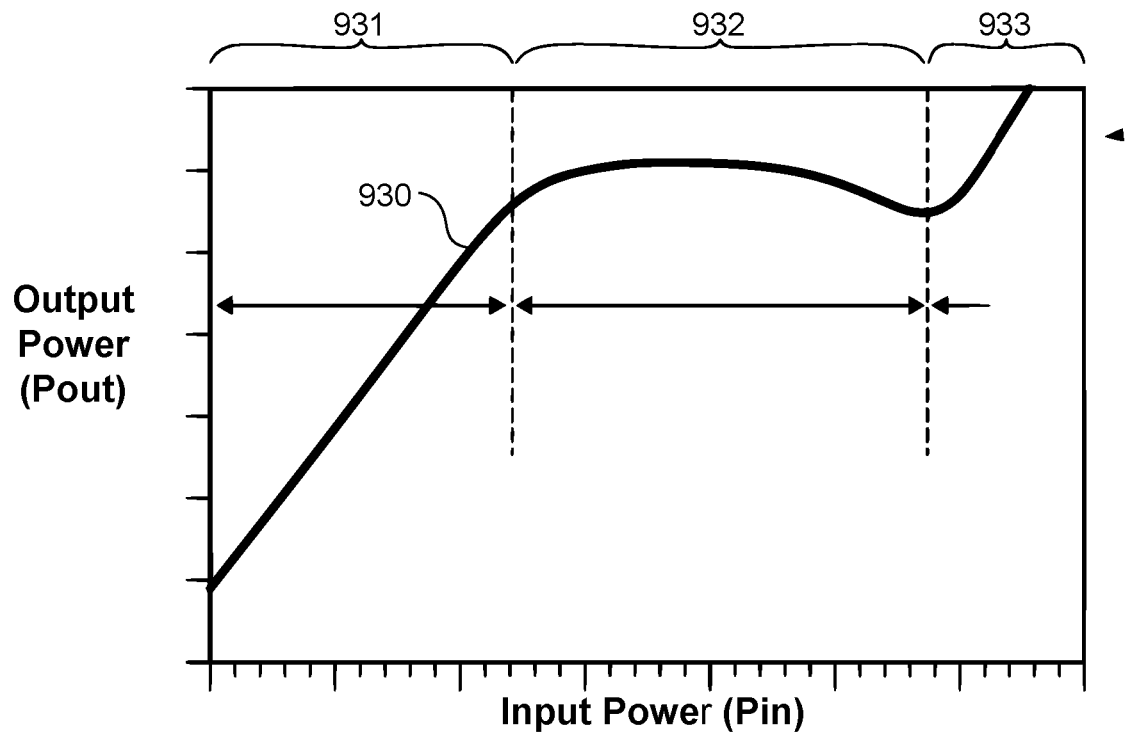
FIG. 20 illustrates an example transfer characteristic of Continuous Wave (CW) output power versus CW input power for a PIN diode based reflective limiter without an integrated Schottky diode detector according to various aspects of the examples described herein.

FIG. 20 illustrates an example transfer characteristic of Continuous Wave (CW) output power (Pout) versus CW input power (Pin) for a PIN diode based reflective limiter without an integrated Schottky diode detector according to various aspects of the examples described herein. The PIN diode based reflective limiter associated with the transfer characteristic shown in FIG. 20 does not include an integrated Schottky diode. The transfer characteristic waveform 930 extends through low insertion loss region 931, limiting region 932, and saturation region 933.

When a small incident power Pin is applied to a PIN diode limiter (i.e., region 931), the electric field resulting from the incident power may not be large enough to force carriers to move from the anode and the cathode of the PIN diode into the intrinsic layer. The PIN diode can remain in an off-state mode in this case. In the off-state mode, the impedance of the PIN diode is mostly characterized by an off-state capacitor $C_{off}$ and a very high resistance. In region 931, the transfer characteristic of the PIN diode limiter is in a low insertion loss region, where the loss of the limiter is minimum and mostly determined by the small mismatch loss due to the capacitive reactance of the diode.

As the CW input power Pin increases above the 1 dB compression level (i.e., region 932), the electric field resulting from the incident power temporarily forces carriers to move from the anode and the cathode of the PIN diode into the intrinsic layer. The intrinsic layer region, originally highly resistive in the off-state mode, becomes more conductive and exhibits a much lower resistance. The resulting resistance value is controlled by the amount of power applied. The impedance mismatch due to the sudden change of impedance in the PIN diode limiter becomes significant and most of the incident CW signal power is reflected to the source. In region 932, the transfer characteristic of the PIN diode limiter is in a limiting region defined by the flat leakage, which is the amount of power leaking through the limiter. By reflecting the power rather than dissipating it, the limiter may potentially handle a large amount of power without damage.

This applies until reaching the saturation region 933 where one or more PIN diodes of the limiter fully turn on. The RF current in the PIN diode increases rapidly with no limitation, eventually causing critical failure of the PIN diode limiter. Prior to reaching critical failure, the PIN diode usually reaches a maximum operating junction temperature allowed by the given process on which the PIN diode has been fabricated. For a typical PIN diode process, the maximum operating junction temperature $Tj_{max}$ for a MTTF of greater than a million hours is typically 150° C. $Tj_{max}$ is process dependent and other maximum temperatures may be allowed.

Figure 21:
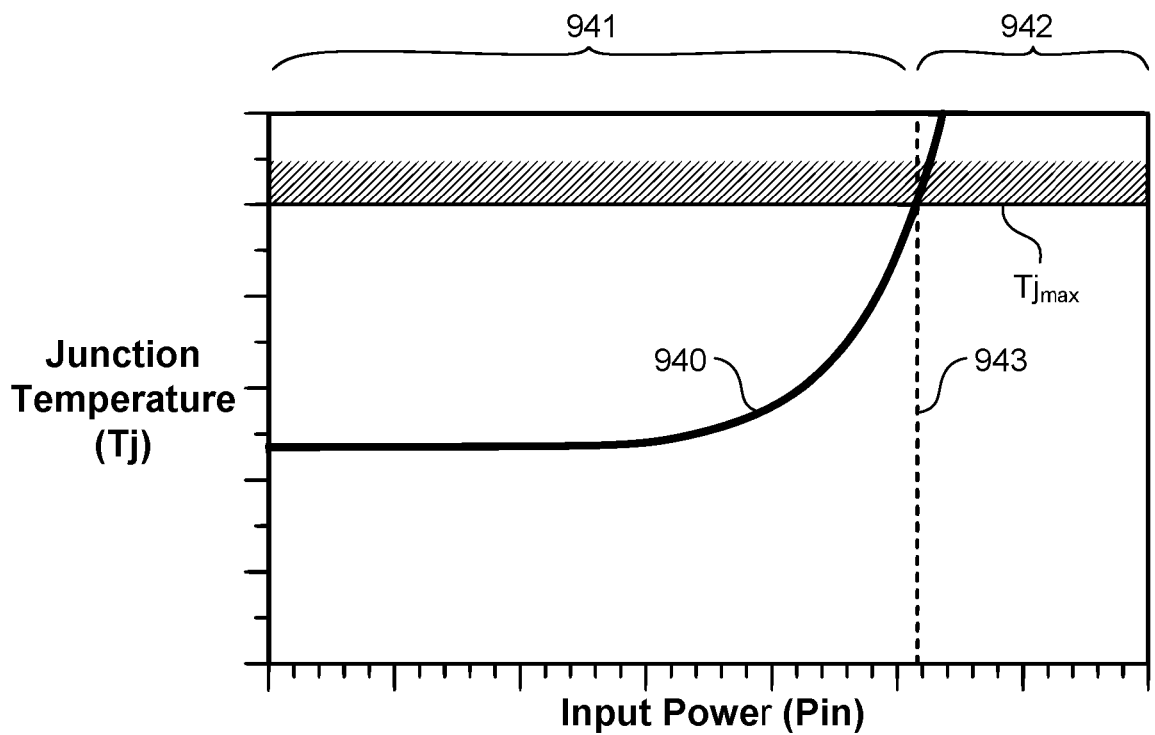
FIG. 21 illustrates an example PIN diode junction temperature response versus CW input power for a PIN diode based reflective limiter with the transfer characteristic shown in FIG. 16 according to various aspects of the examples described herein.

FIG. 21 illustrates an example PIN diode junction temperature (TJ) response versus CW input power for a PIN diode based reflective limiter with the transfer characteristic shown in FIG. 16 according to various aspects of the examples described herein. The junction temperature waveform 940 extends through normal operating region 941 and over temperature region 942 when the temperature passes the maximum operating junction temperature $Tj_{max}$ for a given process. The CW input power at which the junction temperature of the hottest diode in the limiting assembly reaches the maximum operating junction temperature $TJ_{max}$ defines the maximum CW power handling capability. In the limiting region 931 as described in FIG. 20, the incident power is efficiently reflected to the source rather than dissipated in the PIN diode, the PIN diode limiter exhibits a low rise of the diode junction temperature. Line 943 represents the maximum CW power capability at which the hottest PIN diode of the limiter reaches the maximum operating temperature. The CW input power at which the junction temperature of the hottest diode in the limiting assembly reaches the maximum operating junction temperature defines the maximum CW power handling capability.

For a PIN diode based reflective limiter, the maximum CW power handling capability is reached within limiting region 931 of the transfer characteristic of the limiter and much sooner than reaching the saturation region 933.

Figure 22:
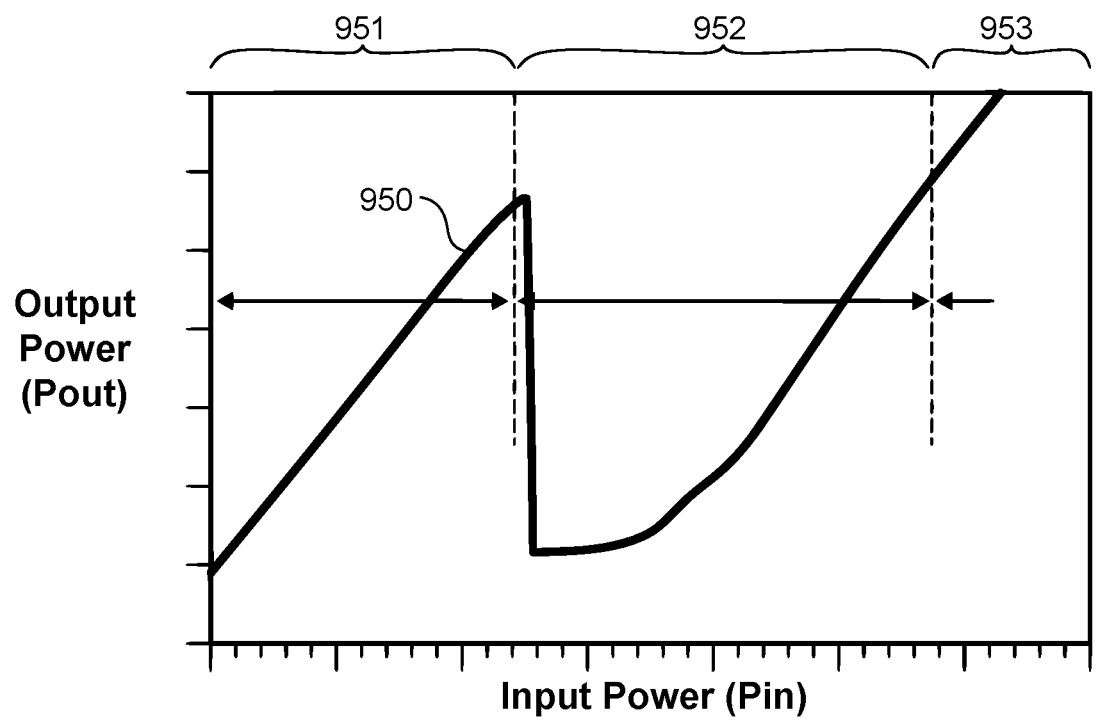
FIG. 22 illustrates an example transfer characteristic of CW output power versus CW input power for a PIN diode based reflective limiter with an integrated Schottky diode detector according to various aspects of the examples described herein.

FIG. 22 illustrates an example transfer characteristic of CW output power (Pout) versus CW input power (Pin) for a PIN diode based reflective limiter with an integrated Schottky diode detector according to various aspects of the examples described herein. Transfer characteristic waveform 950 extends through low insertion loss region 951, limiting region 952, and saturation region 953. At low incident CW power and below the 1 dB compression level, the transfer characteristic in the low insertion loss region 951 is similar to the transfer characteristic of a PIN diode based reflective limiter without the integrated Schottky detector. The RF coupler can be efficiently integrated into the limiter input matching network with minimum mismatch and therefore minimum effect on the overall limiter small-signal response.

Figure 23:
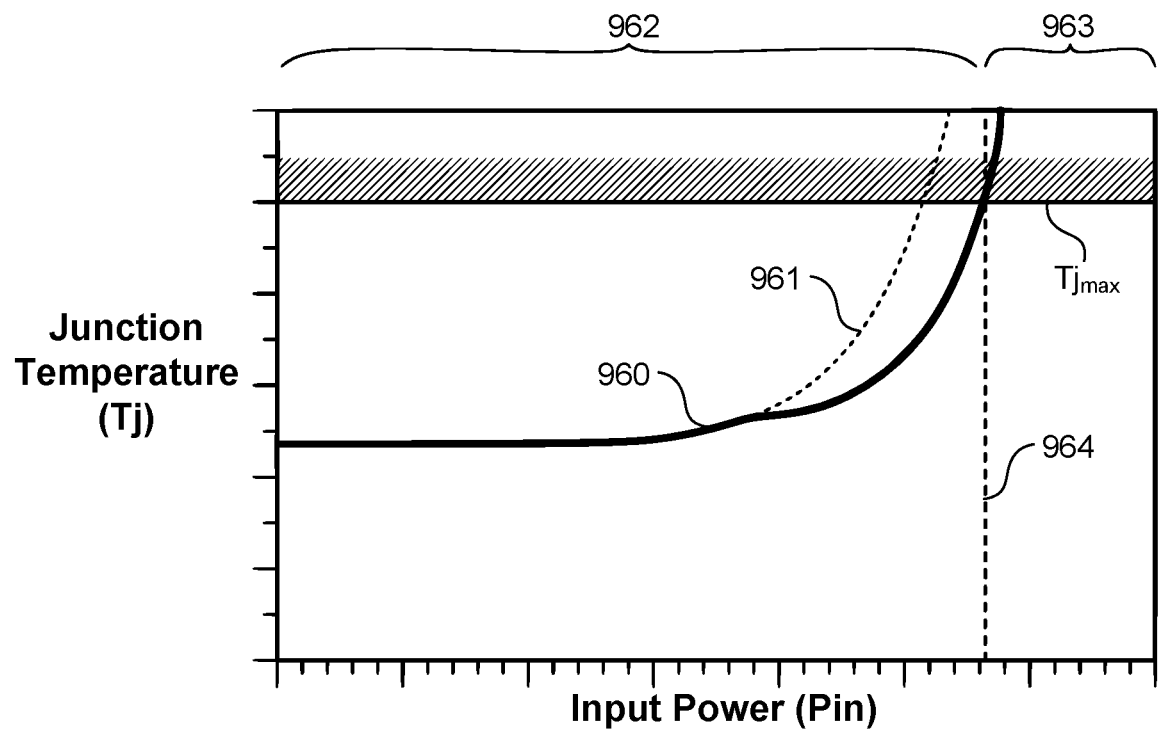
FIG. 23 illustrates an example PIN diode junction temperature response versus CW input power for a PIN diode based reflective limiter with an integrated Schottky diode detector according to various aspects of the examples described herein.

FIG. 23 illustrates an example PIN diode junction temperature response versus CW input power for a PIN diode based reflective limiter with an integrated Schottky diode detector according to various aspects of the examples described herein. Compared to the junction temperature characteristic shown in FIG. 21, it exhibits significant improvement of the maximum CW power handling capability. The junction temperature waveform 960 extends through normal operating region 962 and over temperature region 963. The junction temperature waveform 961 shows the TJ of the same PIN diode reflective limiter but without the Schottky diode detector. As the CW input power increases, a small portion of the power is coupled to the Schottky diode through the RF coupler. Because the Schottky diode exhibits a low turn-on voltage that is much lower than the PIN diode, only a small portion of the power applied to the diode is sufficient to forces carriers to move between the Schottky anode and the Schottky cathode, and the Schottky diode turns on. As the Schottky diode tuns on, the PIN diode limiting assembly sees the forward bias from the Schottky diode, resulting in a modification of the energy band diagram for each PIN diode of the PIN diode limiting assembly. The modification of the energy band diagram for each PIN diode creates a wider depletion region that goes beyond the intrinsic region and facilitates the injection of carriers from the anode and cathode regions into the depletion region. As a result, the amount of incident power needed to force carriers to move from the anode and cathode regions into the intrinsic region or layer of the PIN diode is much less. With only a small amount of power applied to the Schottky enhanced PIN limiter, the PIN diodes become more conductive. The impedance mismatch due to the sudden change of impedance in the limiting diode assembly becomes significant and most of the incident CW power is reflected to the source. Line 964 represents the maximum CW power capability.

The Schottky-enhanced PIN diode limiters described herein can include one or more Schottky diodes, one or more PIN diodes, RF couplers, inductors, capacitors, transmission lines, and can be fully integrated over a common substrate as a MMIC device. The power coupled by the RF coupler to the Schottky diode is efficiently transferred with minimum loss and added parasitic due to the assembly. Thus, only a small portion of the incident power is required, resulting in a sharp response of the limiter with incident power. Additionally, the feedback loop created by the detector assembly adds a minimum parasitic to the PIN diode passive reflective implemented without the Schottky detector resulting in practically no loss of frequency bandwidth of operation. For the design of hybrid Schottky-enhanced PIN diode limiter, a trade-off can be made between the Schottky diode size, defining its off-state capacitance, and the parasitic brought by the feedback loop resulting in a deep resonance in band or at the edge of the desired band. Given the level of integration possible using the concepts described herein, this trade-off is less stringent, and the useable frequency bandwidth of the Schottky-enhanced PIN diode limiters is practically identical to the frequency bandwidth of an integrated PIN diode limiter implemented without a Schottky detector.

The structures and methods described herein can be used to fabricate a wide variety of useful integrated circuits. For example, the PIN and NIP diodes described above can be integrated with various components in a monolithic circuit format suitable for microwave circuit applications. Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Although relative terms such as "on," "below," "upper," "lower," "top," "bottom," "right," and "left" may be used to describe the relative spatial relationships of certain structural features, these terms are used for convenience only, as a direction in the examples. When a structure or feature is described as being "over" (or formed over) another structure or feature, the structure can be positioned over the other structure, with or without other structures or features intervening between them. When two components are described as being "connected to" or "coupled to" each other, the components can be electrically coupled to each other, with or without other components being electrically coupled and intervening between them. When two components are described as being "directly connected to" or "directly coupled to" each other, the components can be electrically coupled to each other, without other components being electrically coupled between them.

Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified. The terms "first," "second," etc. are used only as labels, rather than a limitation for a number of the objects.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

The invention claimed is:

1. A monolithic semiconductor, comprising:
a substrate;
a plurality of layers of semiconductor materials over the substrate;
Schottky and Ohmic contacts on a first subset of the plurality of layers for a Schottky diode;
PIN diode Ohmic contacts on a second subset of the plurality of layers for a PIN diode; and
an etch stop layer between the first subset of the plurality of layers and the second subset of the plurality of layers, wherein each layer among the first subset of the plurality of layers for the Schottky diode is different than each layer among the second subset of the plurality of layers for the PIN diode.

2. The monolithic semiconductor according to claim 1, wherein:
the first subset of the plurality of layers comprises an active Schottky layer and a cathode layer; and
the etch stop layer is under the cathode layer.

3. The monolithic semiconductor according to claim 2, wherein the second subset of the plurality of layers comprises an anode layer, an intrinsic layer, and a second cathode layer under the etch stop layer.

4. The monolithic semiconductor according to claim 1, wherein the plurality of layers comprise a first cathode layer, an intrinsic semiconductor layer, an anode layer, a second cathode layer, and an active Schottky layer.

5. The monolithic semiconductor according to claim 4, wherein the etch stop layer is between the anode layer and the second cathode layer.

6. The monolithic semiconductor according to claim 1, further comprising an electrical component over the substrate and electrically connected to at least one of the Schottky diode and the PIN diode.

7. The monolithic semiconductor according to claim 1, further comprising a metal-insulator-metal capacitor, a resistor, and an inductor over the substrate.

8. The monolithic semiconductor according to claim 7, wherein the capacitor, resistor, inductor, PIN diode, and Schottky diode are electrically connected as a monolithic microwave integrated circuit limiter.

9. The monolithic semiconductor according to claim 1, further comprising a radio frequency coupler over the substrate.

10. The monolithic semiconductor according to claim 1, further comprising a passivation layer over the PIN diode and the Schottky diode.

11. The monolithic semiconductor according to claim 1, wherein the substrate comprises a Gallium Arsenide substrate.

12. A monolithic semiconductor, comprising:
a substrate;
a plurality of layers of semiconductor materials over the substrate;
Schottky and Ohmic contacts on a first subset of the plurality of layers for a Schottky diode;
PIN diode Ohmic contacts on a second subset of the plurality of layers for a PIN diode; and
a via that extends from a backside of the substrate to a cathode contact of the PIN diode, wherein each layer among the first subset of the plurality of layers for the Schottky diode is different than each layer among the second subset of the plurality of layers for the PIN diode.

13. A monolithic semiconductor, comprising:
a substrate;
a plurality of layers of semiconductor materials over the substrate;
Schottky and Ohmic contacts on a first subset of the plurality of layers for a Schottky diode;
PIN diode Ohmic contacts on a second subset of the plurality of layers for a PIN diode; and
a via that extends from a backside of the substrate to a cathode contact of the Schottky diode, wherein each layer among the first subset of the plurality of layers for the Schottky diode is different than each layer among the second subset of the plurality of layers for the PIN diode.

14. The monolithic semiconductor according to claim 1, further comprising:
a passive circuit element over the substrate; and
a via that extends from a backside of the substrate to a contact of the passive circuit element.

15. The monolithic semiconductor according to claim 14, further comprising a back side metallization on a backside of the substrate, the back side metallization extending into the via and being electrically connected to one of a cathode contact of the PIN diode, a cathode contact of the Schottky diode, or a passive circuit element over the substrate.

16. A monolithic semiconductor, comprising:
a substrate;
a plurality of layers of semiconductor materials over the substrate;
Schottky and Ohmic contacts on a first subset of the plurality of layers for a Schottky diode; and
PIN diode Ohmic contacts on a second subset of the plurality of layers for a PIN diode, wherein:
each layer among the first subset of the plurality of layers is different than each layer among the second subset of the plurality of layers, and
the PIN diode comprises a plurality of PIN diodes and the Schottky diode comprises a plurality of Schottky diodes.

17. The monolithic semiconductor according to claim 16, wherein a first PIN diode among the plurality of PIN diodes is series connected and a second PIN diode among the plurality of PIN diodes is shunt connected.

18. The monolithic semiconductor according to claim 16, wherein a first Schottky diode among the plurality of Schottky diodes is series connected and a second Schottky diode among the plurality of Schottky diodes is shunt connected.

19. The monolithic semiconductor according to claim 1, wherein:
the first subset of the plurality of layers comprises an active Schottky layer and a first cathode layer;
the monolithic semiconductor further comprises a first etch stop layer over the Schottky layer and a second etch stop layer under the first cathode layer;
the monolithic semiconductor further comprises at least one semiconductor layer over the first etch stop layer; and
the second subset of the plurality of layers comprises an anode layer, an intrinsic layer, and a second cathode layer under the second etch stop layer.

20. A monolithic Schottky-enhanced PIN diode limiter, comprising:
a substrate;
a plurality of layers of semiconductor materials over the substrate;
Schottky and Ohmic contacts on a first subset of the plurality of layers for a Schottky diode;

PIN diode Ohmic contacts on a second subset of the plurality of layers for a PIN diode;

an etch stop layer between the first subset of the plurality of layers and the second subset of the plurality of layers;

a passivation layer over the Schottky diode and the PIN diode; and passive circuit elements for the limiter, the passive circuit elements formed over the passivation layer, wherein each layer among the first subset of the plurality of layers for the Schottky diode is different than each layer among the second subset of the plurality of layers for the PIN diode.

21. The monolithic Schottky-enhanced PIN diode limiter according to claim 20, wherein the passive circuit elements comprise a capacitor, an inductor, and an RF coupler.

22. The monolithic Schottky-enhanced PIN diode limiter according to claim 20, wherein:

the first subset of the plurality of layers comprises an active layer and a first cathode layer over the etch stop layer; and the second subset of the plurality of layers comprises an anode layer, an intrinsic layer, and a second cathode layer under the etch stop layer.

* * * * *